United States Patent
Liu et al.

(10) Patent No.: US 11,018,255 B2
(45) Date of Patent: May 25, 2021

(54) DEVICES AND SYSTEMS WITH STRING DRIVERS INCLUDING HIGH BAND GAP MATERIAL AND METHODS OF FORMATION

(71) Applicant: Micron Technology, Inc., Boise, ID (US)

(72) Inventors: Haitao Liu, Boise, ID (US); Guangyu Huang, Boise, ID (US); Chandra V. Mouli, Boise, ID (US); Akira Goda, Boise, ID (US); Deepak Chandra Pandey, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/110,217

(22) Filed: Aug. 23, 2018

(65) Prior Publication Data
US 2019/0067475 A1   Feb. 28, 2019

Related U.S. Application Data

(60) Provisional application No. 62/551,353, filed on Aug. 29, 2017.

(51) Int. Cl.
*H01L 29/78* (2006.01)
*H01L 29/24* (2006.01)
(Continued)

(52) U.S. Cl.
CPC .... *H01L 29/7827* (2013.01); *H01L 21/02565* (2013.01); *H01L 21/02592* (2013.01);
(Continued)

(58) Field of Classification Search
CPC .......... H01L 29/7827; H01L 29/0849; H01L 29/247; H01L 29/42364; H01L 29/267;
(Continued)

(56) References Cited

U.S. PATENT DOCUMENTS 8,102,712 B2   1/2012   Goda et al.
8,431,961 B2   4/2013   Liu et al.
(Continued)

FOREIGN PATENT DOCUMENTS

KR   10-2014-0011570 A   1/2014

OTHER PUBLICATIONS

Li , Silicon-Germanium Structure in Surrounding-gate Strained Silicon Nanowire Field Effect Transistor. Journal of Computational Electronics 3: pp. 251-255, 2004 (Year: 2004).*
(Continued)

*Primary Examiner* — Galina G Yushina
(74) *Attorney, Agent, or Firm* — TraskBritt

(57) ABSTRACT

A device includes a string driver comprising a channel region between a drain region and a source region. At least one of the channel region, the drain region, and the source region comprises a high band gap material. A gate region is adjacent and spaced from the high band gap material. The string driver is configured for high-voltage operation in association with an array of charge storage devices (e.g., 2D NAND or 3D NAND). Additional devices and systems (e.g., non-volatile memory systems) including the string drivers are disclosed, as are methods of forming the string drivers.

24 Claims, 13 Drawing Sheets

(51) Int. Cl.

| | |
|---|---|
| *H01L 29/423* | (2006.01) |
| *H01L 29/267* | (2006.01) |
| *H01L 27/11556* | (2017.01) |
| *H01L 29/66* | (2006.01) |
| *H01L 21/02* | (2006.01) |
| *H01L 21/44* | (2006.01) |
| *H01L 27/11582* | (2017.01) |
| *H01L 29/08* | (2006.01) |
| *H01L 21/425* | (2006.01) |
| *H01L 29/10* | (2006.01) |
| *H01L 29/786* | (2006.01) |
| *H01L 27/1157* | (2017.01) |
| *H01L 29/36* | (2006.01) |
| *H01L 29/49* | (2006.01) |
| *H01L 29/417* | (2006.01) |

(52) U.S. Cl.
CPC ............ *H01L 21/425* (2013.01); *H01L 21/44* (2013.01); *H01L 27/1157* (2013.01); *H01L 27/11556* (2013.01); *H01L 27/11582* (2013.01); *H01L 29/0847* (2013.01); *H01L 29/1037* (2013.01); *H01L 29/247* (2013.01); *H01L 29/267* (2013.01); *H01L 29/42364* (2013.01); *H01L 29/66969* (2013.01); *H01L 29/7869* (2013.01); *H01L 29/78642* (2013.01); H01L 21/0262 (2013.01); H01L 29/36 (2013.01); H01L 29/41741 (2013.01); H01L 29/495 (2013.01)

(58) Field of Classification Search
CPC ........... H01L 29/66969; H01L 29/1037; H01L 29/36; H01L 29/495; H01L 29/41741; H01L 29/78642; H01L 27/11556; H01L 27/11521; H01L 27/11568; H01L 27/11524; H01L 27/1157; H01L 21/02565; H01L 21/44; H01L 21/425; H01L 21/02592
See application file for complete search history.

(56) References Cited

U.S. PATENT DOCUMENTS

| | | | |
|---|---|---|---|
| 8,493,790 B2 | 7/2013 | Goda et al. | |
| 8,792,260 B2* | 7/2014 | Fujita | H02M 7/217 363/127 |
| 9,064,577 B2 | 6/2015 | Zhao et al. | |
| 9,105,468 B2 | 8/2015 | Rabkin et al. | |
| 9,111,591 B2 | 8/2015 | Tanzawa | |
| 9,129,859 B2 | 9/2015 | Liu et al. | |
| 9,177,872 B2 | 11/2015 | Sandhu | |
| 9,209,199 B2 | 12/2015 | Simsek-Ege et al. | |
| 9,281,044 B2 | 3/2016 | Ramaswamy et al. | |
| 9,424,936 B1 | 8/2016 | Tanzawa et al. | |
| 9,437,604 B2 | 9/2016 | Lu et al. | |
| 9,443,907 B2 | 9/2016 | Rabkin et al. | |
| 2004/0262681 A1* | 12/2004 | Masuoka | H01L 29/78642 257/335 |
| 2009/0279359 A1* | 11/2009 | Goda | G11C 16/0483 365/185.17 |
| 2010/0213458 A1 | 8/2010 | Prall | |
| 2010/0213538 A1* | 8/2010 | Fukuzumi | G11C 5/02 257/326 |
| 2010/0320459 A1* | 12/2010 | Umeda | H01L 29/7869 257/43 |
| 2011/0133266 A1 | 6/2011 | Tang et al. | |
| 2012/0256247 A1* | 10/2012 | Alsmeier | H01L 29/7926 257/319 |
| 2013/0181230 A1* | 7/2013 | Watanabe | H01L 21/02381 257/77 |
| 2014/0021485 A1* | 1/2014 | Cho | H01L 29/1054 257/77 |
| 2014/0054670 A1 | 2/2014 | Lee et al. | |
| 2014/0239247 A1* | 8/2014 | Park | H01L 27/2463 257/4 |
| 2014/0241092 A1 | 8/2014 | Ha | |
| 2014/0264525 A1 | 9/2014 | Takahashi et al. | |
| 2015/0014632 A1* | 1/2015 | Kim | H01L 33/0004 257/24 |
| 2015/0041873 A1* | 2/2015 | Karda | H01L 29/24 257/295 |
| 2015/0048296 A1* | 2/2015 | Park | H01L 27/228 257/2 |
| 2015/0069377 A1 | 3/2015 | Rabkin et al. | |
| 2015/0171106 A1* | 6/2015 | Suh | H01L 27/11582 257/324 |
| 2015/0214317 A1* | 7/2015 | Masuoka | H01L 29/7827 257/329 |
| 2015/0372104 A1 | 12/2015 | Liu et al. | |
| 2015/0372135 A1 | 12/2015 | Park | |
| 2016/0049406 A1 | 2/2016 | Sandhu | |
| 2016/0073466 A1* | 3/2016 | Tsunetsugu | H03K 3/012 315/149 |
| 2016/0240254 A1* | 8/2016 | Chen | H01L 27/11565 |
| 2016/0240665 A1* | 8/2016 | Chen | H01L 29/0847 |
| 2016/0343570 A1* | 11/2016 | Watanabe | H01L 21/02381 |
| 2017/0053986 A1 | 2/2017 | Liu et al. | |
| 2017/0104000 A1* | 4/2017 | Park | H01L 27/11582 |
| 2017/0154990 A1* | 6/2017 | Sung | H01L 21/02532 |

OTHER PUBLICATIONS

International Written Opinion from International Application No. PCT/US2018/047809, dated Dec. 12, 2018, 7 pages.
International Search Report from International Application No. PCT/US2018/047809, dated Dec. 12, 2018, 3 pages.
Wu et al., Film-Profile-Engineered IGZO Thin-Film Transistors with Gate/Drain Offset for High Voltage Operation, 2016 IEEE 23rd International Symposium on the Physical and Failure Analysis of Integrated Circuits (IPFA), (2016), pp. 272-275.
Nag et al., Single-Source Dual-Layer Amorphous IGZO Thin-Film Transistors for Display and Circuit Applications, Journal of the SID, vol. 21, No. 3, (2013), pp. 129-136.
Kaneko et al., A Novel BEOL Transistor (BETr) with InGaZnO Embedded in Cu— Interconnects for On-chip High Voltage I/Os in Standard CMOS LSIs, 2011 Symposium on VLSI Technology Digest of Technical Papers, (2011), pp. 120-121.
Korean Office Action for Application No. 10-2020-7008393, dated Feb. 22, 2021, 9 pages.

* cited by examiner

DEVICES AND SYSTEMS WITH STRING DRIVERS INCLUDING HIGH BAND GAP MATERIAL AND METHODS OF FORMATION

CROSS-REFERENCE TO RELATED APPLICATION

This application claims the benefit, under 35 U.S.C. § 119(e), of U.S. Provisional Patent Application Ser. No. 62/551,353, filed Aug. 29, 2017, the disclosure of which is incorporated herein in its entirety by this reference.

TECHNICAL FIELD

The disclosure, in various embodiments, relates generally to devices with non-volatile memory. More particularly, this disclosure relates to devices with NAND flash memory arrays in operable communication with at least one string driver.

BACKGROUND

Memory provides data storage for electronic systems. Flash memory is one of various memory types and has numerous uses in modern computers and devices. A typical flash memory device may include a memory array that has a large number of charge storage devices (e.g., memory cells, e.g., non-volatile memory cells) arranged in rows and columns. In a NAND architecture type of flash memory, storage devices arranged in a column are coupled in series, and the first storage device of the column is coupled to a bit line. In "two-dimensional NAND" (which may also be referred to herein as "2D NAND"), the storage devices are arranged in row and column fashion along a horizontal surface. In "three-dimensional NAND" (which may also be referred to herein as "3D NAND"), a type of vertical memory, not only are the storage devices arranged in row and column fashion in a horizontal array, but tiers of the horizontal arrays are stacked over one another to provide a "three-dimensional array" of the storage devices.

In 3D NAND, access lines, which may also be known as "wordlines," may each operably connect the storage devices corresponding to a respective tier of the three-dimensional array. In 2D NAND, access lines may operably connect storage devices corresponding to a row or column of the two-dimensional array. In either 2D or 3D NAND, string drivers may be in operational communication with the access lines. That is, the string drivers drive the access line (e.g., word line) voltages to write to or read from the charge storage devices of the arrays. Each charge storage device may be electrically programmed by charging a floating gate of the device, and the charging is controlled, at least in part, by operation of the string driver.

String drivers of NAND arrays are operated at high voltages (i.e., at voltages above 20 V). At high voltages, it may be difficult to provide a string driver that meets desired criteria, such as a high breakdown voltage (at least 30 V breakdown voltage), relatively low band-to-band leakage and low impact ionization leakage, sufficiently high drive current, low floating body effects, and associated circuitry that is not overly complex. Providing string drivers that meet these criteria may be particularly challenging in 3D NAND arrays, in which large numbers of stacked tiers also makes scalability of string drivers important. Conventional structures and materials for string drivers often require large dimensions (e.g., long lateral double-diffused offsets (e.g., LDD offsets of at least about 1.0 micrometers (at least about 1.0 µm)) or increasingly complex structures or circuitry (e.g., multiple gates per channel region) to accommodate high-voltage operation. Therefore, the structures of and materials for string drivers, for high-voltage operation with non-volatile memory arrays, continue to present challenges.

DETAILED DESCRIPTION

Figure 1:
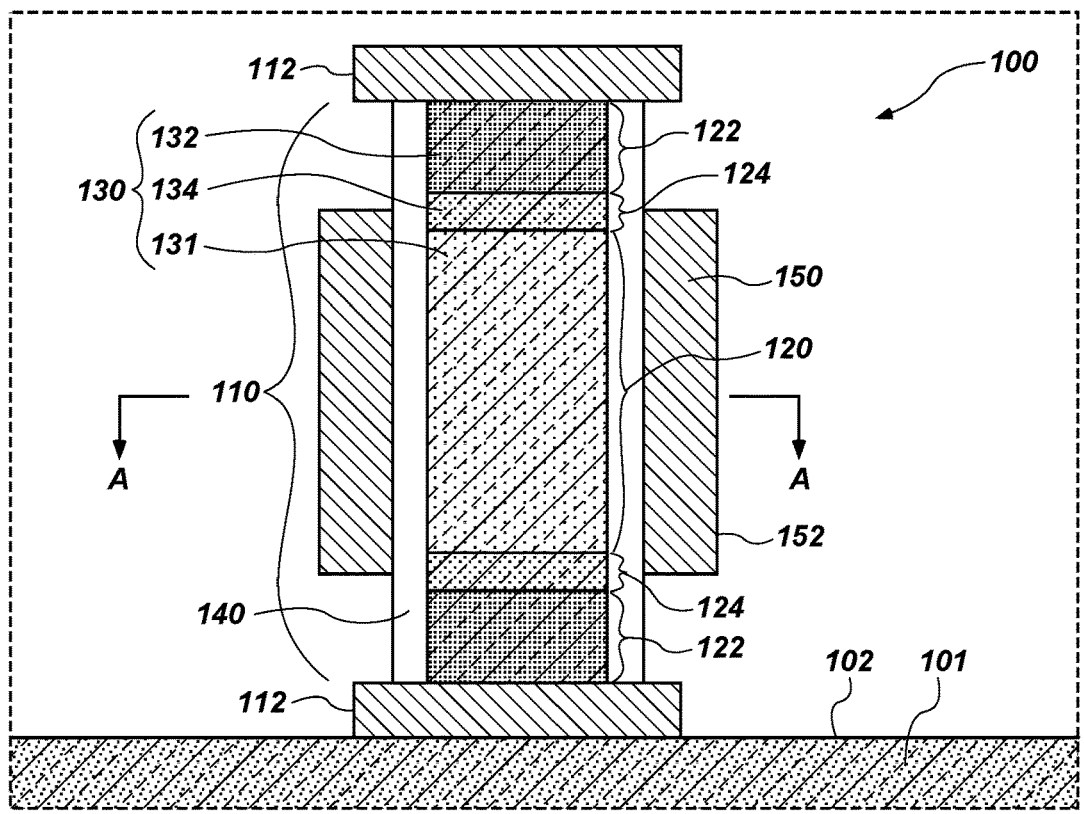
FIG. 1 is a cross-sectional, elevational, schematic illustration of a string driver according to an embodiment of the present disclosure, wherein a high band gap material occupies a central portion and the string driver is configured for operational connection to charge storage devices in a 3D NAND array.

Devices and systems including string drivers and methods of forming related structures are disclosed. The string drivers of the devices and systems include a "high band gap" material in or around the channel region of the string driver. As used herein, the term "high band gap material" means and includes a material with a greater (e.g., wider) energy band gap than the band gap of polysilicon, i.e., a band gap greater than about 1.12 eV. The high band gap material may have an energy band gap of at least about 1.5 eV (e.g., greater than about 1.5 eV, e.g., greater than about 3.0 eV, at least about 3.2 eV, at least 3.2 eV). The high band gap material may also have high mobility. As used herein, "high mobility" means and includes a mobility of greater than about 5 cm$^2$/V·s (e.g., at least about 10 cm$^2$/V·s, e.g., 10 cm$^2$/V·s to about 50 cm$^2$/V·s, e.g., greater than about 15 cm$^2$/V·s). Therefore, the high band gap material may have a higher mobility than polysilicon (which has a mobility of from about 5 cm$^2$/V·s to about 15 cm$^2$/V·s).

With a high band gap and high mobility material for or around the channel region, coupled with other features of embodiments of the disclosed structures, the string drivers may be formed with compact size and with accompanying circuitry that is similar or the same in complexity as conventional accompanying circuitry. For example, a single gate region may be used and the lateral double-diffused offset region between the channel region and the drain/source region, i.e., a region offsetting the drain/source regions from the gate, may be short (e.g., less than 0.20 micrometers (less than 0.20 µm), e.g., 0 micrometers (0 µm) (wherein the channel region may contact the drain/source regions)). With such structures, band-to-band leakage and impact ionization leakage may be minimized, high breakdown voltage (i.e., a breakdown voltage of at least about 30 V) may be exhibited, while still achieving sufficient drive current and reduced floating body effects (e.g., electron hole pairs of significantly less than 1000 electron hole pairs, e.g., about 10 electron hole pairs). The electric field at gate-drain and gate-source corners may also be reduced, relative to conventional string drivers, by using the high band gap material.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium (Si$_{1-x}$Ge$_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "precursor," when referring to a material, region, or structure, means and refers to a material, region, or structure to be transformed into a resulting material, region, or structure. For example, and without limitation, a "precursor material" may refer to a material that is to be patterned during formation of a final region or structure.

As used herein, the term "amorphous," when referring to a material, means and refers to a material having a substantially noncrystalline structure.

As used herein, the term "vertical" means and includes a direction that is perpendicular to the width and length of the respective region. "Vertical" may also mean and include a direction that is perpendicular to a primary surface of the substrate on which a referenced material or structure is located.

As used herein, the term "horizontal" means and includes a direction that is parallel to at least one of the width and length of the respective region. "Horizontal" may also mean and include a direction that is parallel to a primary surface of the substrate on which the referenced material or structure is located.

As used herein, the term "between" is a spatially relative term used to describe the relative disposition of one material, region, or sub-region relative to at least two other materials, regions, or sub-regions. The term "between" may encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate to" is a spatially relative term used to describe disposition of one material, region, or sub-region near to another material, region, or sub-region. The term "proximate" includes dispositions of indirectly adjacent to, directly adjacent to, and internal to.

As used herein, the term "about," when preceding a number, refers to the number exactly, any number that would round to that number, and other numbers approximating the number while still been operably effective. Thus, a description of a length of "about 1.0 micrometer" would include a length of 1.0 micrometer exactly, lengths in the range of 0.5 micrometers to 1.4 micrometers, as well as other numbers approximating 1.0 micrometer that are still operably effective.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, stages, operations, elements, materials, components, and/or groups, but do not preclude the presence or addition of one or more other features, regions, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, species, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

FIG. 1 illustrates an embodiment of a string driver 100 according to the present disclosure, which string driver 100 is configured for high-voltage operation and is in operable communication with a three-dimensional array of charge storage devices (e.g., non-volatile memory devices, e.g., NAND flash memory cells). The string driver 100 may be above, below, or laterally adjacent to charge storage devices of an array (not shown in FIG. 1).

The string driver 100 includes a pillar portion 110 extending vertically, relative to a primary surface 102 of a substrate 101, between a pair of electrodes 112, one of which being a source electrode and the other being a drain electrode. The pillar portion 110 includes a channel region 120 between drain/source regions 122 that are each offset from the channel region 120 by an offset region 124 (e.g., a lateral double-diffused (LDD) offset).

The pillar portion 110 includes a high band gap material 130 in or near the channel region 120 (e.g., in the channel region 120, in the offset regions 124, and/or in the drain/source regions 122). The high band gap material 130 of the pillar portion 110 may be, in whole or in part, crystalline (e.g., monocrystalline) or amorphous.

The high band gap material 130 in the channel region 120 may be an undoped high band gap material 131, which may comprise, consist essentially of, or consist of one or more of zinc oxide, indium gallium zinc oxide, indium zinc oxide, silicon carbide, tin oxide, or gallium arsenide. The indium gallium zinc oxide may be in amorphous form. The relative stoichiometries of the elements of the foregoing compounds may be other than one. Thus, the high band gap material 130 may be a semiconductor material having an energy band gap of greater than 1.12 eV (e.g., at least about 1.5 eV (e.g., greater than about 1.5 eV, e.g., greater than about 3.0 eV, at least about 3.2 eV, at least 3.2 eV)).

The high band gap material 130 in the drain/source regions 122 may be a doped high band gap material 132, which comprises the same material as the undoped high band gap material 131 with the addition of at least one dopant. The at least one dopant may be an n-type dopant selected from the group consisting of aluminum (Al) and silicon (Si). The at least one dopant may not comprise phosphorous (P) or arsenic (As). Thus, the drain/source regions 122 are defined by the presence of the doped high band gap material 132.

Between the undoped high band gap material 131 of the channel region 120 and the doped high band gap material 132, the high band gap material 130 may include less doping (i.e., a "less-doped high band gap material" 134) and define the offset regions 124. For example, while the doped high band gap material 132 may include a dopant concentration of about $1 \times 10^{18}$ at/cm$^3$ to about $1 \times 10^{21}$ at/cm$^3$, the "less-doped" high band gap material may include a lower dopant concentration of less than about $1\times10^{17}$ at/cm$^3$. The offset regions 124 may include a gradient of the at least one dopant, with a higher dopant concentration adjacent the drain/source regions 122 and a lesser dopant concentration adjacent the channel region 120. Therefore, a boundary between the offset regions 124 and each of the channel region 120 and the drain/source regions 122 may not necessarily be along a straight line.

A dielectric material 140 circumscribes the pillar portion 110, surrounding a sidewall of the high band gap material 130. The dielectric material 140 spaces the high band gap material 130 from a gate region 150 that is adjacent the channel region 120. Thus, the high band gap material 130 may be on (e.g., adjacent, directly adjacent, in direct physical contact with) the dielectric material 140. The dielectric material 140 may comprise at least one electrically insulative material, e.g., an oxide (e.g., silicon dioxide (SiO$_2$)).

The gate region 150 may comprise a conductive material (e.g., a conductive metal (e.g., tungsten (W)) and may extend a height of the channel region 120 and partially along a height of each of the offset regions 124. Though the gate region 150 is illustrated to have an external sidewall 152 just wider than a width of the illustrated electrodes 112, the external sidewall 152 may be much further away from the pillar portion 110, e.g., it may extend to another of the pillar portions 110 of the string driver 100, as further discussed below.

Because the high band gap material 130 is used in the pillar portion 110, in or about the channel region 120, the offset regions 124 may each be short, i.e., less than 0.20 micrometers (less than 0.20 μm) (e.g., about 0.1 μm to about 0.15 μm; or about 0 μm), without incurring detrimental band-to-band leakage, impact ionization leakage, electrical fields at the gate-drain and gate-source corners, and floating body effects when operating the string driver 100 at a high voltage (e.g., a voltage of at least 20 V). The shorter offset region 124 also lowers the resistance in the pillar portion 110, as compared to using a non-high band gap material such as silicon or polysilicon, which enables a sufficient drive current through the string driver 100 during operation thereof to communicate with an array of charge storage devices.

Further, the high band gap material 130 in or around the channel region 120 enables operation of the string driver 100 at high voltage even with only a single gate region (e.g., the gate region 150) adjacent the channel region 120. Inclusion of only a single gate region 150 per pillar portion 110 enables the string driver 100 to be operable with accompanying circuitry that is less complex than the circuitry that may accompany a string driver having multiple gates along a channel region. The single gate as well as the short length of the offset regions 124 also enable formation of the pillar portion 110, and therefore the remainder of the string driver 100, at a compact size, compared to a string driver having multiple gate regions along a channel region and/or long offset regions (e.g., lateral double-diffused offsets of about 1.0 μm or more). With a compact size and non-complex accompanying circuitry, the string driver 100 is conducive for inclusion in 3D NAND arrays with a large number of tiers (e.g., greater than 100 tiers, e.g., between 100 tiers and about 200 tiers), with each tier providing at least one horizontal array of charge storage devices. In some embodiments, the string driver 100 may be disposed laterally adjacent to a stack of the tiers.

With continued reference to FIG. 1, the high band gap material 130 of the string driver 100 may occupy a central portion of the pillar portion 110. For example, the high band gap material 130 may fill, or substantially fill, the area between the dielectric material 140.

Figure 2:
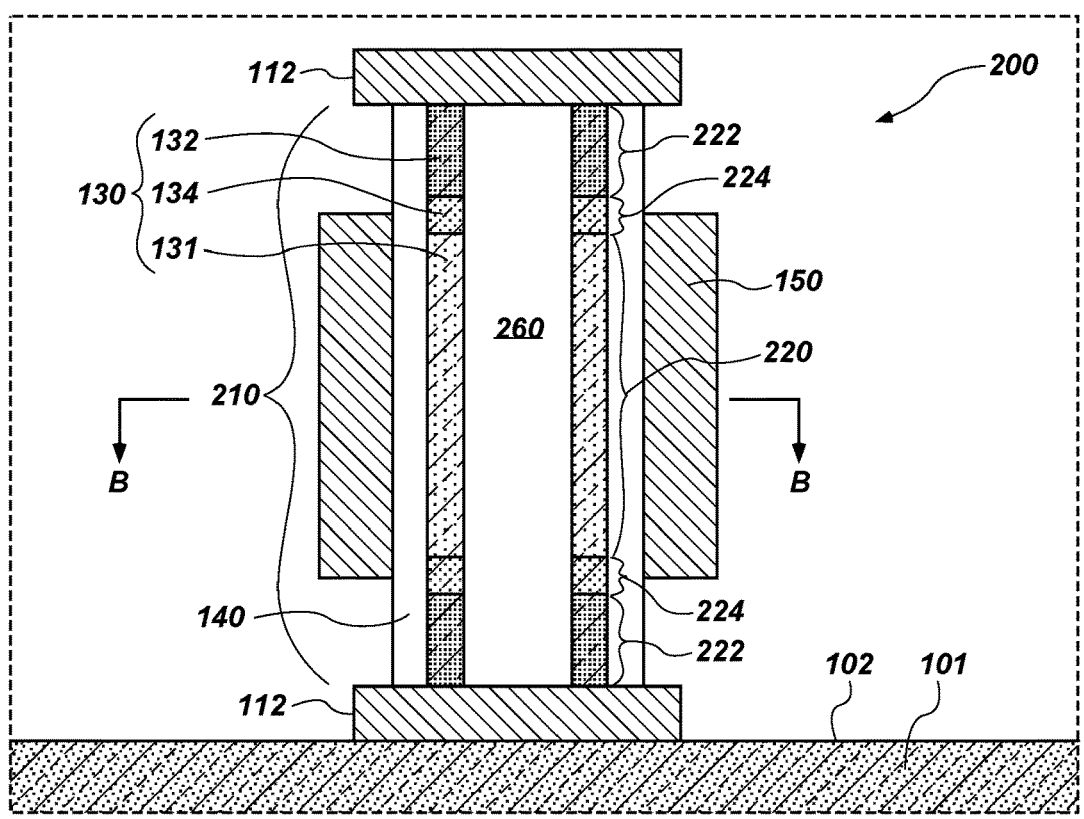
FIG. 2 is a cross-sectional, elevational, schematic illustration of a string driver according to an embodiment of the present disclosure, wherein a high band gap material circumscribes a central portion and the string driver is configured for operational connection to charge storage devices in a 3D NAND array.

With reference to FIG. 2, a string driver 200 may include another dielectric material 260 occupying a central portion of a pillar portion 210. A channel region 220, drain/source regions 222, and offset regions 224 may circumscribe the other dielectric material 260. As with the string driver 100 of FIG. 1, the string driver 200 may include the dielectric material 140 around the channel region 220, the drain/source regions 222, and the offset regions 224. The other dielectric material 260 may comprise, consist essentially of, or consist of an electrically insulative material (e.g., an oxide (e.g., silicon dioxide (SiO$_2$)), air), which may be the same as or different than the dielectric material 140. Again, a single gate (e.g., the gate region 150) may be included while still enabling the string driver 200 to be operable at high voltage, for a 3D NAND array, with the above-discussed advantages.

Figure 3:
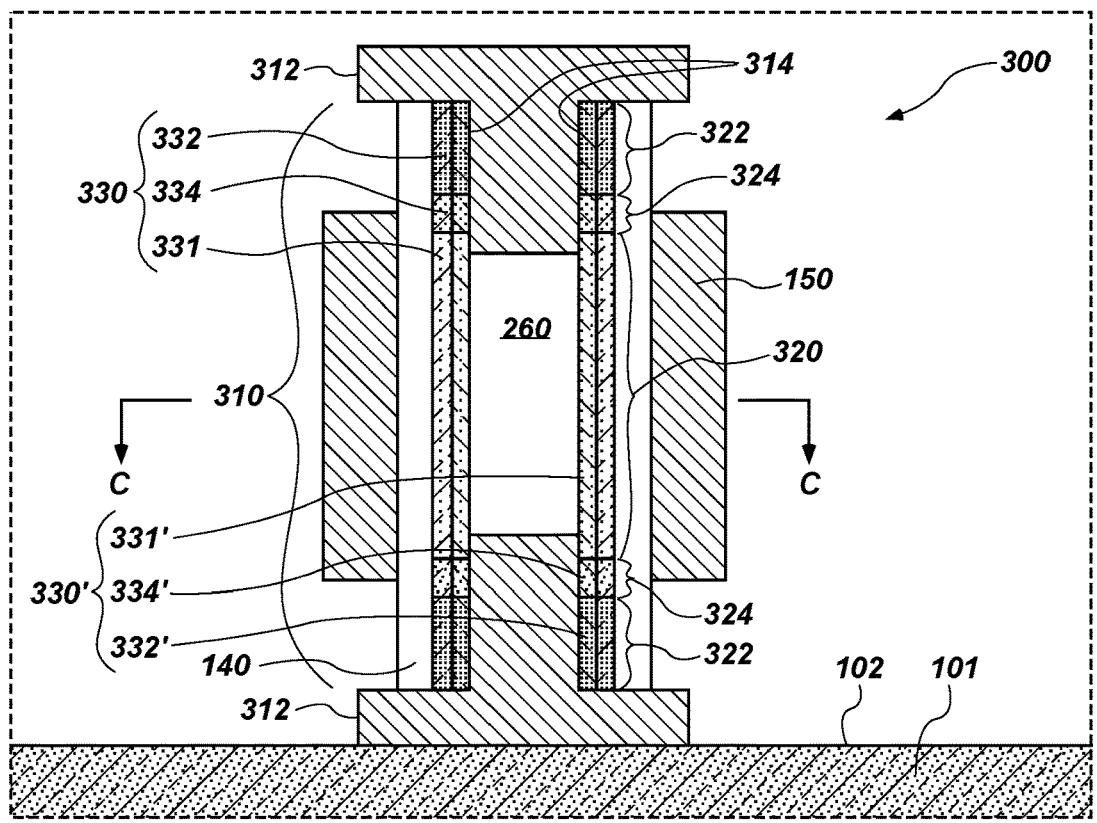
FIG. 3 is a cross-sectional, elevational, schematic illustration of a string driver according to an embodiment of the present disclosure, wherein multiple high band gap materials circumscribe a central portion and the string driver is configured for operational connection to charge storage devices in a 3D NAND array.

With reference to FIG. 3, a string driver 300 may include a plurality of high band gap materials in a pillar portion 310. For example, the string driver 300 may include an outer sub-region of a high band gap material 330 (including undoped high band gap material 331 in a channel region 320, doped high band gap material 332 in drain/source regions 322, and less-doped high band gap material 334 in offset regions 324) and an inner sub-region of another high band gap material 330' (including undoped other high band gap material 331' in the channel region 320, doped other high band gap material 332' in the drain/source regions 322, and less-doped other high band gap material 334' in offset regions 324). Each of the high band gap material 330 and the other high band gap material 330' may be selected from the group consisting of zinc oxide, indium gallium zinc oxide, indium zinc oxide, silicon carbide, tin oxide, and gallium arsenide.

For example, the high band gap material 330 of the outer sub-region may comprise, consist essentially of, or consist of one of the previously mentioned oxides while the other high band gap material 330' may be a different high band gap material (i.e., a high band gap material of a different oxide or also the same oxide but with a different stoichiometry (e.g., different atomic ratios of elements)) than that of the high band gap material 330, or a non-oxide material. The high band gap material 330 of the outer sub-region may comprise, consist essentially of, or consist of an oxide while the other high band gap material 330' of the inner sub-region may comprise, consist essentially of, or consist of another, different oxide. Both the high band gap material 330 and the other high band gap material 330' may comprise, consist essentially of, or consist of an oxide, with a lower oxygen content in the oxide of the high band gap material 330 of the outer sub-region as compared to the oxide of the high band gap material 330' of the inner sub-region. The high band gap material 330 of the outer sub-region may comprise, consist essentially of, or consist of an oxide while the other high band gap material 330' of the inner sub-region may comprise, consist essentially of, or consist of a different oxide.

The use of more than one high band gap material may enable improved reliability, lessened leakage, and improved mobility as compared to structures including only one high band gap material.

Each sub-region (e.g., film) of the plurality of the high band gap material 330, 330' may be thin (e.g., defining a thickness of a few nanometers (i.e., 3 nanometers (3 nm)) up to tens of nanometers (i.e., between 10 nanometers (10 nm) and 100 nanometers (100 nm)). The high band gap material 330 and the other high band gap material 330' may define the same or different thicknesses.

The electrodes above and below the pillar portion 310, i.e., source/drain electrodes 312 may include a sidewall contact extension portion 314 that extends into the pillar portion 310. The increased contact between the conductive material of the electrodes 312 and the other high band gap material 330' promotes electrical communication, enabling improved contact resistance than would be achievable without the sidewall contact extension portions 314. The sidewall contact extension portions 314 may extend past the upper/lower ends of the gate region 150. The other dielectric material 260 may occupy the remaining portion of the pillar portion 310 between the sidewall contact extension portions 314 of the electrodes 312.

Each of the string drivers 100, 200, 300 of FIGS. 1 through 3 are configured for high-voltage operation and in operative communication with three-dimensional arrays of charge storage devices (e.g., three-dimensional non-volatile memory arrays, e.g., 3D NAND) with the advantages discussed above with respect to the string driver 100 of FIG. 1. The string drivers 100, 200, 300 may be laterally disposed relative to a stack of tiers (e.g., more than 100 tiers) of the 3D NAND array. In other embodiments, the string drivers 100, 200, 300 may be disposed above or below such stack of tiers.

Figure 4:
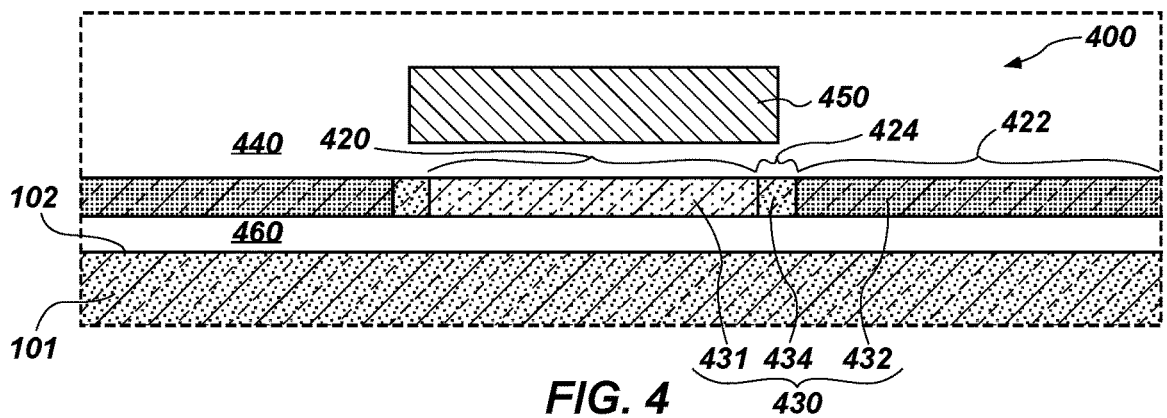
FIG. 4 is a cross-sectional, elevational, schematic illustration of a string driver according to an embodiment of the present disclosure, wherein a high band gap material forms a horizontal channel region and the string driver is configured for operational connection to charge storage devices in an array (e.g., a 2D NAND array or a 3D NAND array).

High band gap materials are also conducive for use in high-voltage string drivers for not only three-dimensional arrays of charge storage devices (e.g., three-dimensional non-volatile memory arrays, e.g., 3D NAND), but are also conducive for use in high-voltage string drivers for two-dimensional arrays of charge storage devices (e.g., two-dimensional non-volatile memory arrays, e.g., 2D NAND). Such string drivers may be disposed laterally adjacent a horizontal array of charge storage devices or may be disposed above or below the horizontal array. With reference to FIG. 4, illustrated is a string driver 400 that may be conducive for use in either such two-dimensional or three-dimensional arrays. The string driver 400 may include a gate region 450 isolated from a high band gap material 430 by a dielectric material 440. The dielectric material 440 may surround the gate region 450 above, below, and to the sides thereof. Thus, the gate region 450 may be a "floating gate." Another dielectric material 460 is below the high band gap material 430. The high band gap material 430 may comprise, consist essentially of, or consist of any of the materials discussed above with regard to the high band gap material 130, 330 of FIGS. 1 through 3. The dielectric material 440 and the other dielectric material 460 may comprise, consist essentially of, or consist of any of the materials discussed above with regard to the dielectric material 140 and the other dielectric material 260 of FIGS. 1 through 3. The gate region 450 may comprise, consist essentially of, or consist of any of the conductive materials discussed above with regard to the gate region 150 of FIGS. 1 through 3.

A central portion of the high band gap material 430 may be an undoped high band gap material 431 forming a channel region 420 adjacent (e.g., underneath) the gate region 450. Distal portions of the high band gap material 430 may be doped high band gap material 432 to provide drain/source regions 422. The dopants may comprise, consist essentially of, or consist of any of the dopants discussed above with regard to the doped high band gap material 132, 332 of FIGS. 1 through 3. The high band gap material 430 between the channel region 420 and the drain/source regions 422 may be a less-doped high band gap material 434 forming offset regions 424. As with the string drivers 100, 200, 300 of FIGS. 1 through 3, the offset regions 424 may be short (e.g., less than 0.20 micrometers (less than 0.20 μm) (e.g., about 0 μm)); yet, with the high band gap material 430 in or around the channel region 420, the string driver 400 may be conducive for high-voltage operation in a two-dimensional charge storage device array (e.g., a 2D NAND array) or in a three-dimensional charge storage device array (e.g., a 3D NAND array) without detrimental leakage and with sufficient current drive.

Figure 5:
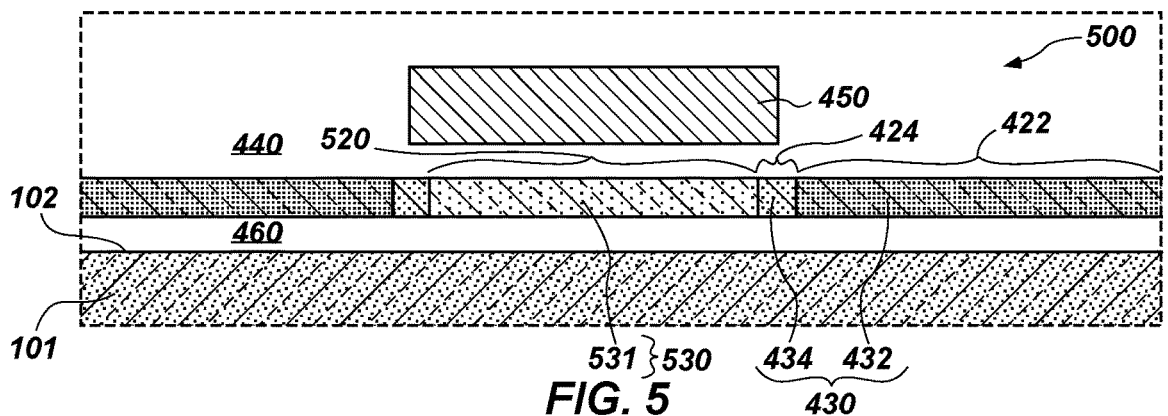
FIG. 5 is a cross-sectional, elevational, schematic illustration of a string driver according to an embodiment of the present disclosure, wherein a high band gap material and a low band gap material form a horizontal channel region and the string driver is configured for operational connection to charge storage devices in an array (e.g., a 2D NAND array or a 3D NAND array).
Figure 6:
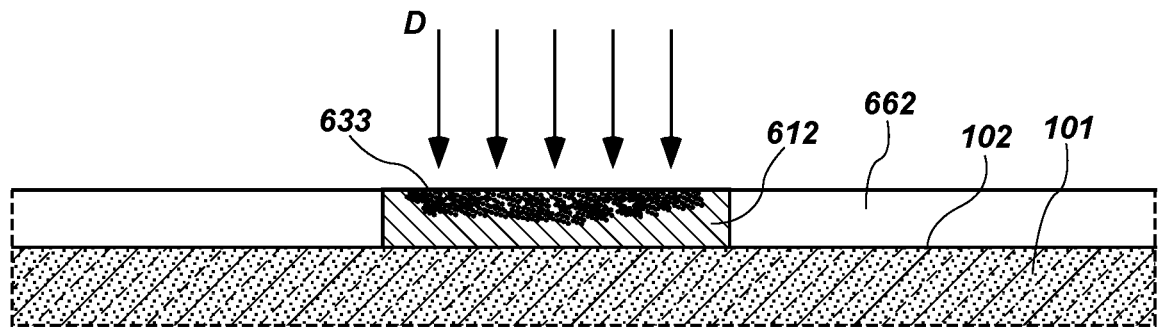
FIGS. 6 through 11 are cross-sectional, elevational, schematic illustrations during various stages of processing to fabricate the string driver of FIG. 1.
Figure 7:
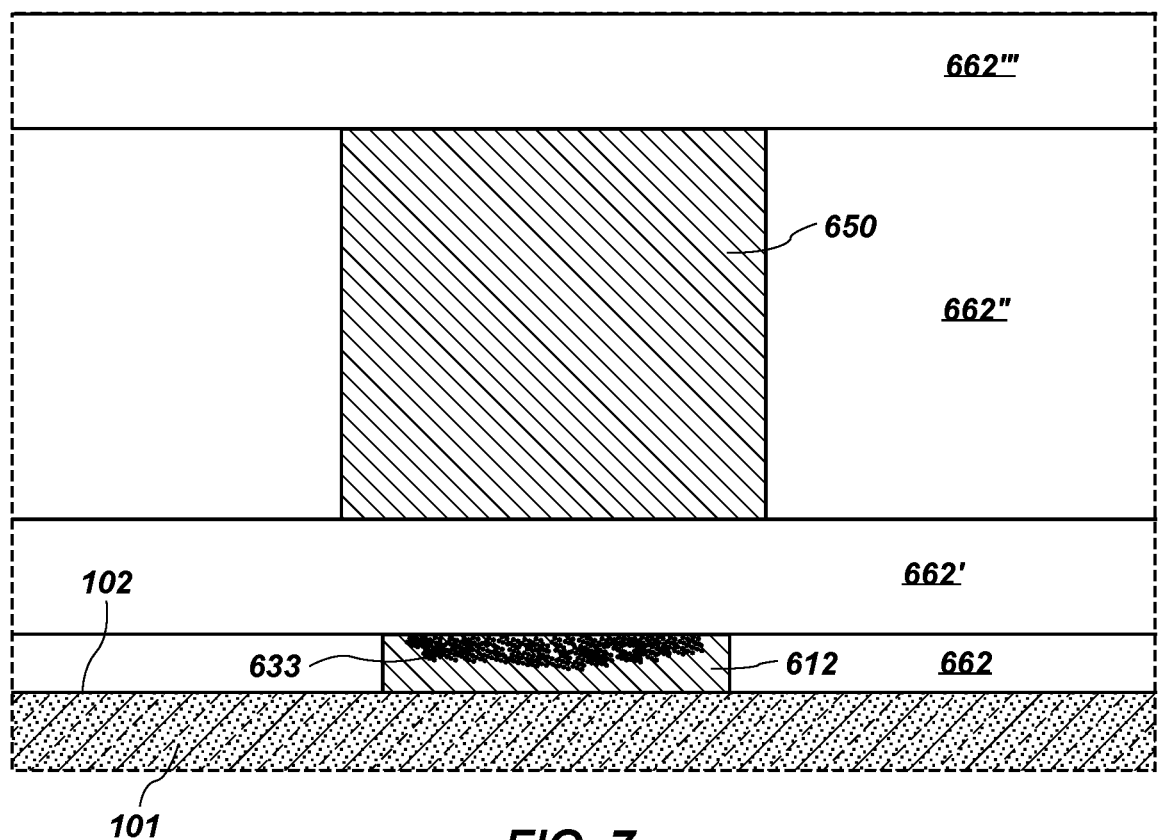

With reference to FIG. 5, a string driver 500 may, alternatively, include a low band gap material 530 (e.g., an undoped low band gap material 531) in a channel region 520. As used herein, the term "low band gap material" means and includes a material with an energy band gap about equal to or less than that of polysilicon (i.e., a band gap of about 1.12 eV or less). The low band gap material 530 may comprise, consist essentially of, or consist of at least one of germanium (Ge), silicon germanium (SiGe), or indium gallium arsenic (InGaAs).

Inclusion of the low band gap material 530 in the channel region 520 between the doped high band gap material 432 of the drain/source regions 422 and the less-doped high band gap material 434 of the offset regions 424 may further enhance current drive through the channel region 520. Therefore, the string driver 500 may be conducive for high-voltage operation in a two-dimensional charge storage device array (e.g., a 2D NAND array) or in a three-dimensional charge storage device array (e.g., a 3D NAND array) without detrimental leakage and with sufficient current drive.

While the string drivers 100, 200, 300, 400, 500 of FIGS. 1 through 5 include at least one dopant in the high band gap material of the drain/source regions and in the high band gap material of the offset regions, in other embodiments, the high band gap material may be free of the at least one dopant. In such embodiments, contact between the conductive material of the electrodes and the high band gap material of the drain/source regions may be sufficient to form Ohmic contacts. Thus, the drain/source regions 122 (FIG. 1), 222 (FIG. 2), 322 (FIG. 3), 422 (FIG. 4 and FIG. 5) and the offset regions 124 (FIG. 1), 224 (FIG. 2), 324 (FIG. 3), 424 (FIG. 4 and FIG. 5) may each consist essentially of the undoped high band gap material 131 (FIG. 1 and FIG. 2), 331 (FIG. 3), 431 (FIG. 4), 531 (FIG. 5), rather than the doped high band gap material 132 (FIG. 1 and FIG. 2), 332/332' (FIG. 3), 432 (FIG. 4 and FIG. 5) and the less-doped high band gap material 134 (FIG. 1 and FIG. 2), 334/334' (FIG. 3), 434 (FIG. 4 and FIG. 5), respectively.

Accordingly, disclosed is a device comprising a string driver. The string driver comprises a channel region between a drain region and a source region. At least one of the channel region, the drain region, and the source region comprises a high band gap material. A gate region is adjacent and spaced from the high band gap material.

With reference to FIGS. 6 through 11, illustrated are various stages in a method of fabricating the string driver 100 of FIG. 1. A conductive material 612 may be formed on the primary surface 102 of a substrate 101 and patterned to provide a lower electrode of the electrodes 112 of FIG. 1. The conductive material 612 may comprise, consist essentially of, or consist of a conductive metal. A first portion of a dielectric material 662 (e.g., an oxide (e.g., silicon dioxide ($SiO_2$)), a nitride (e.g., silicon nitride (SiN)) may be formed adjacent the conductive material 612. Techniques for forming a region of the conductive material 612 disposed within the first portion of the dielectric material 662 will be evident to one of ordinary skill in the art and so are not discussed in detail herein.

In some embodiments, the conductive material 612 may be doped with at least one dopant 633, as indicated by arrows D. The at least one dopant may be the above-discussed n-type dopant selected from the group consisting of aluminum (Al) and silicon (Si) to later be included in the doped high band gap material 132 of FIG. 1. Alternatively, as in embodiments in which the string driver to be fabricated includes no dopant in drain/source regions 122 (FIG. 1), then the doping act of FIG. 6 may be skipped. Accordingly, the amount of the at least one dopant 633 represented by arrows D may be zero (for forming the drain/source regions 122 (FIG. 1) without the at least one dopant 633) or may be greater than zero (for forming the drain/source regions 122 (FIG. 1) with the at least one dopant 633).

A second portion of a dielectric material 662' may be formed over the conductive material 612 and, if included, over the at least one dopant 633. The second portion of the dielectric material 662' may comprise, consist essentially of, or consist of the same or a different dielectric material as the first portion of the dielectric material 662.

A conductive material 650 may be formed over the second portion of the dielectric material 662'. The conductive material 650 may be the conductive material described above with regard to the gate region 150 of FIG. 1. The conductive material 650 may be formed to provide a region within a third portion of a dielectric material 662". The third portion of the dielectric material 662" may comprise, consist essentially of, or consist of the same or a different dielectric material as either or both of the first and second portions of the dielectric material 662, 662'. Techniques for forming a region of the conductive material 650 disposed within the third portion of the dielectric material 662" will be evident to one of ordinary skill in the art and so are not discussed in detail herein.

A fourth portion of a dielectric material 662''' may be formed over the conductive material 650 and over the third portion of the dielectric material 662". The fourth portion of the dielectric material 662''' may comprise, consist essentially of, or consist of the same or a different dielectric material as any or all of the first, second, and third portions of the dielectric material 662, 662', 662".

Figure 8:
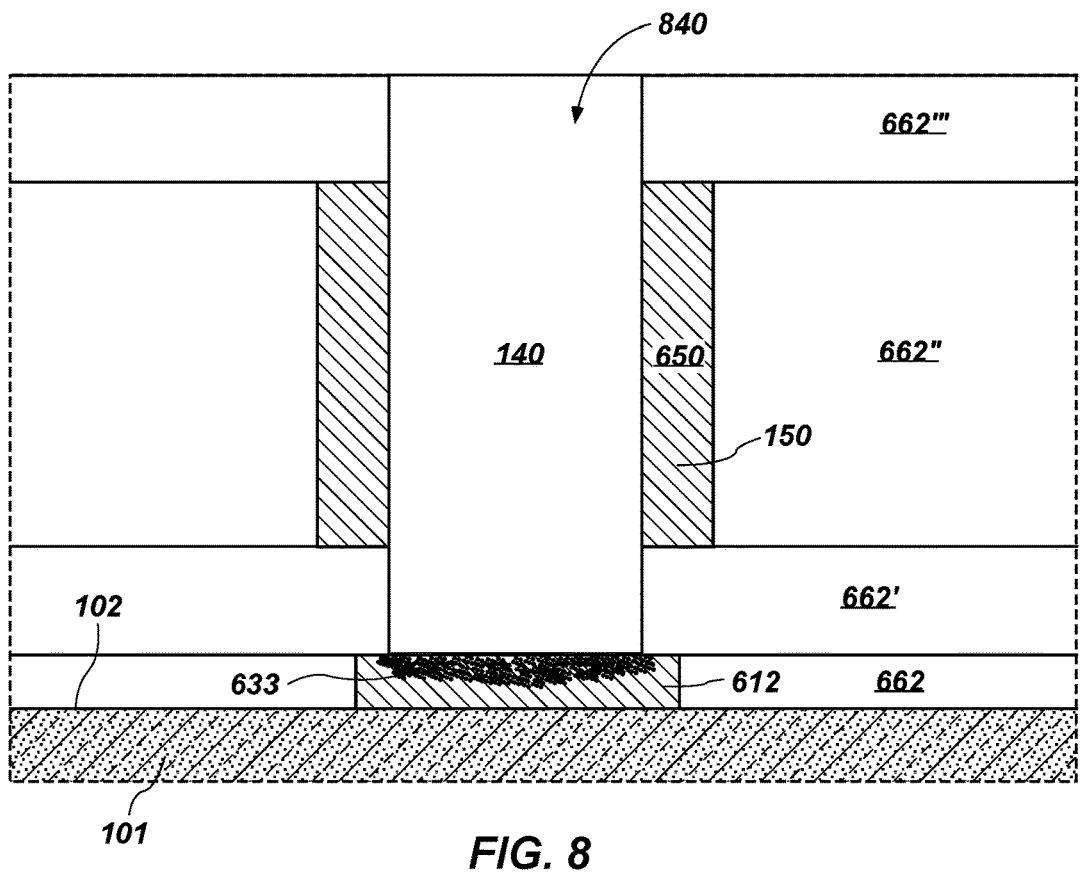

With reference to FIG. 8, an opening 840 may be formed through the conductive material 650 and through each of the second, third, and fourth portions of the dielectric material 662', 662", 662''' and filled with the dielectric material 140 discussed above with respect to FIG. 1. The opening 840 may be formed, e.g., by etching, to expose an upper surface of the conductive material 612, which portion of upper surface may include the at least one dopant 633 if the doping act of FIG. 6 was not skipped. Therefore, the dielectric material 140 may be in physical contact with the conductive material 612.

Figure 9:
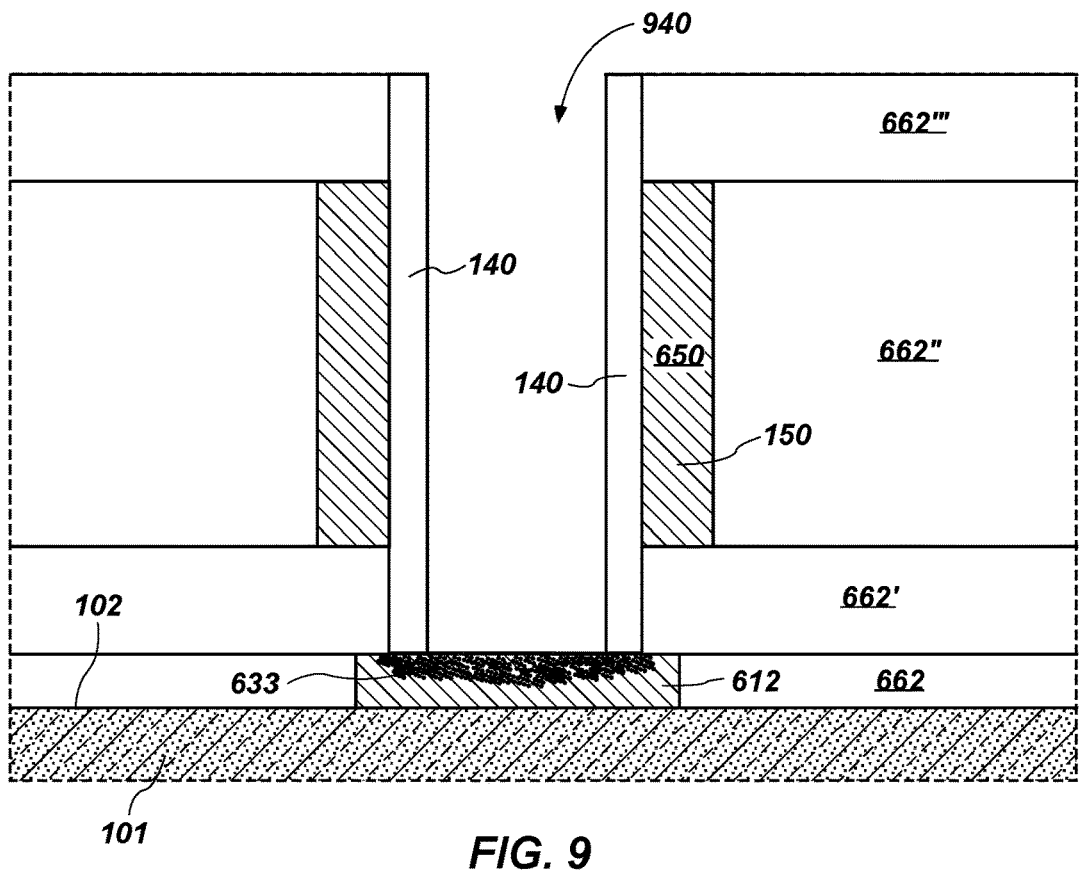

With reference to FIG. 9, another opening 940 may be formed, e.g., by etching, through the dielectric material 140 to expose a portion of the conductive material 612, but not exposing the conductive material 650. In embodiments in which the doping act of FIG. 6 was carried out, the exposed portion of the conductive material 612 may be a portion including the at least one dopant 633.

Figure 10:
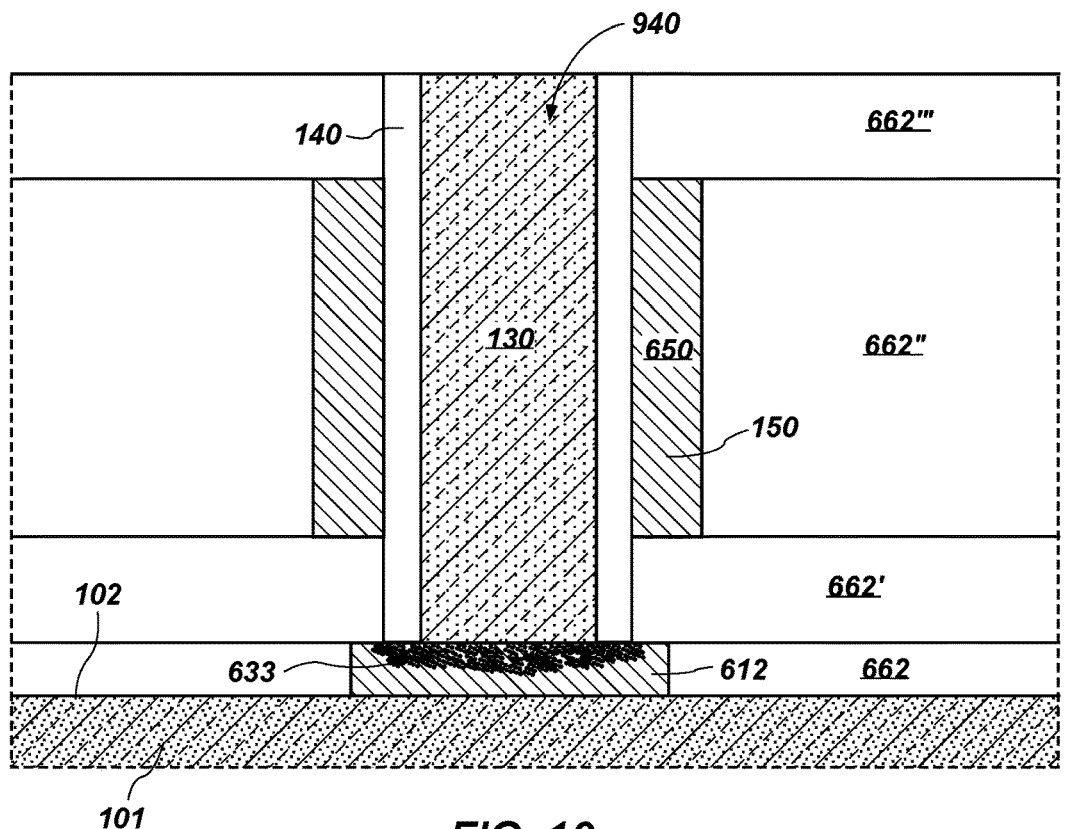
Figure 11:
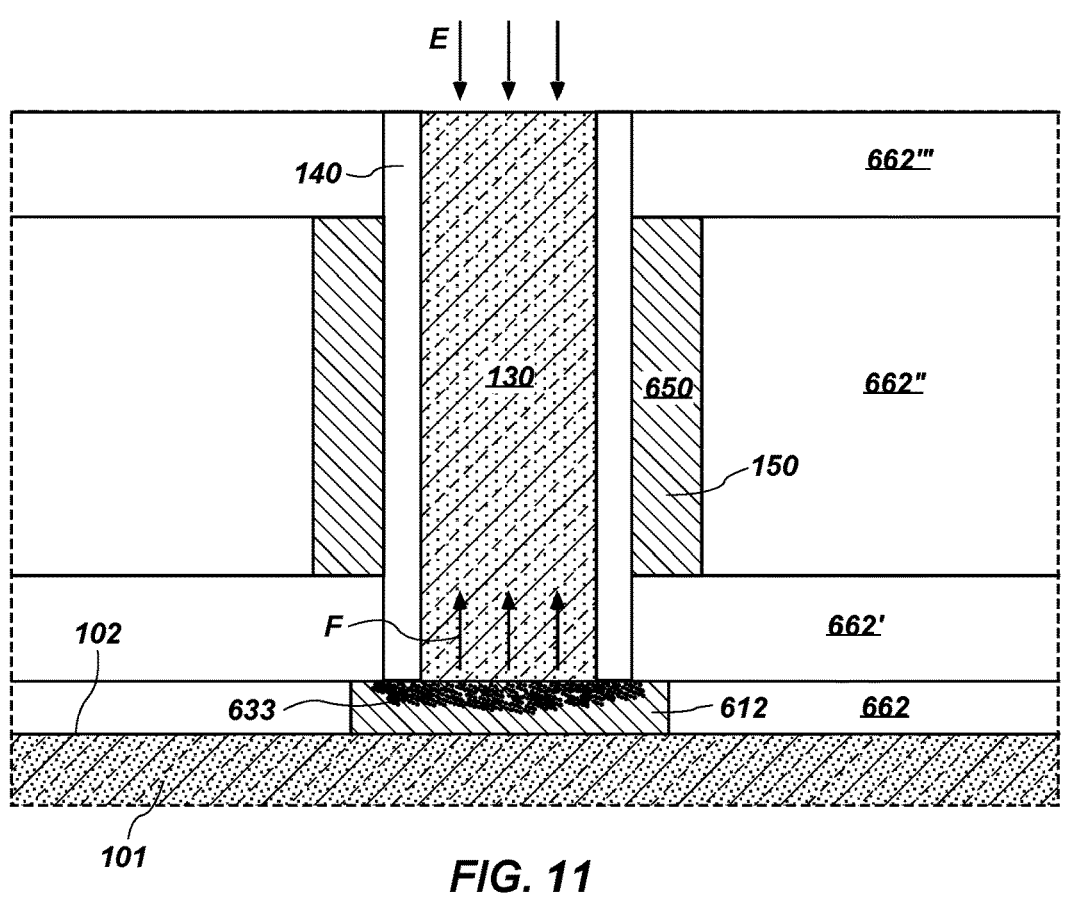

With reference to FIG. 10, the other opening 940 may be filled with the high band gap material 130. In embodiments in which the string driver 100 (FIG. 1) includes the at least one dopant 633 in the drain/source regions 122 and in the offset regions 124 (FIG. 1), then, after filling the other opening 940 with the high band gap material 130, an additional amount of the at least one dopant 633 may be implanted into the upper surface of the high band gap material 130, as indicated by arrows E of FIG. 11. Before, simultaneously, or afterwards, a thermal treatment may be performed to cause the at least one dopant 633 to diffuse from the conductive material 612 into a lower portion of the high band gap material 130, as indicated by arrows F. Thus, the doped high band gap material 132 of the upper portion of the drain/source regions 122 (FIG. 1) is formed by the implantation (arrows E), and the doped high band gap material 132 of the lower portion of the drain/source regions 122 (FIG. 1) is formed by the thermal treatment (arrows F). Otherwise, in embodiments in which the string driver does not include the at least one dopant 633 in the drain/source regions 122 or in the offset regions 124 (FIG. 1), then, after filling the other opening 940 with the high band gap material 130, no additional dopant is added and no thermal treatment may be performed. Accordingly, the amount of the additional amount of the at least one dopant 633 represented by arrows E may be zero (for forming the drain/source regions 122 (FIG. 1) without the at least one dopant 633) or may be greater than zero (for forming the drain/source regions 122 (FIG. 1) with the at least one dopant 633). Additional conductive material to form the upper portion of the source/drain electrodes 112 may then be formed over the high band gap material 130, to form the string driver 100 of FIG. 1.

Figure 12:
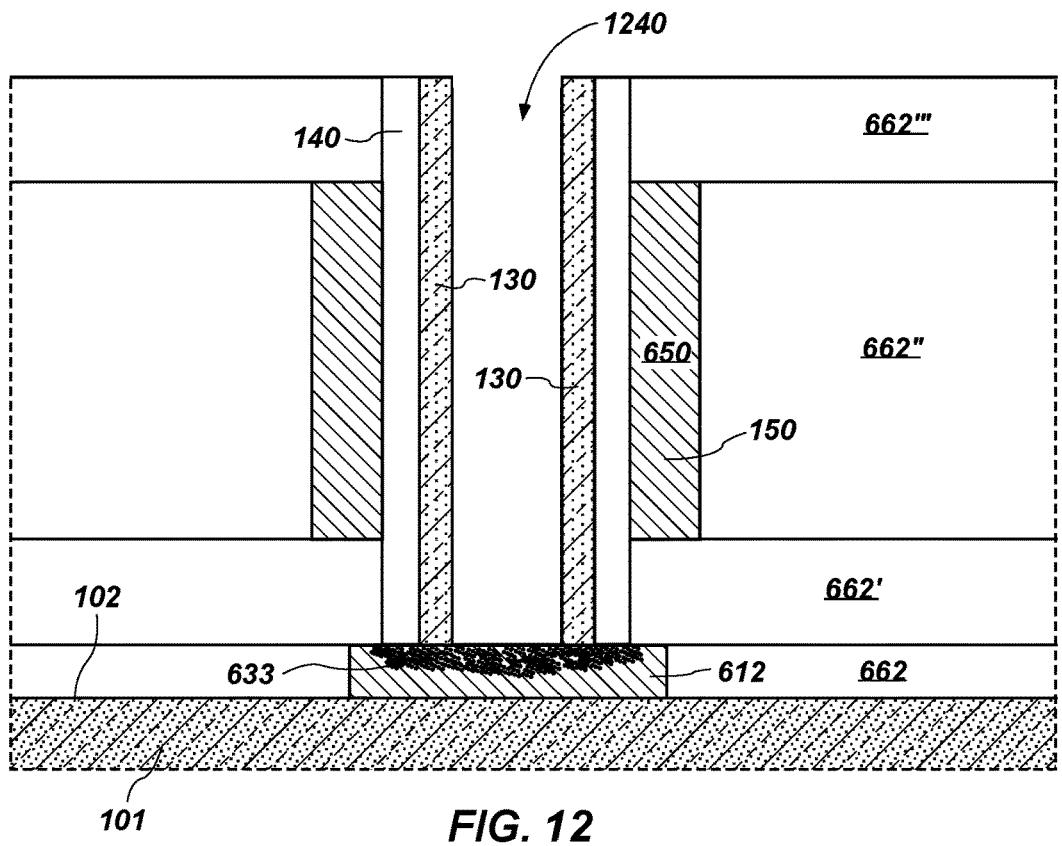
FIGS. 12 and 13 are cross-sectional, elevational, schematic illustrations during various stages of processing to fabricate the string driver of FIG. 2, wherein the stages of FIGS. 12 and 13 follow those of FIGS. 6 through 10.
Figure 13:
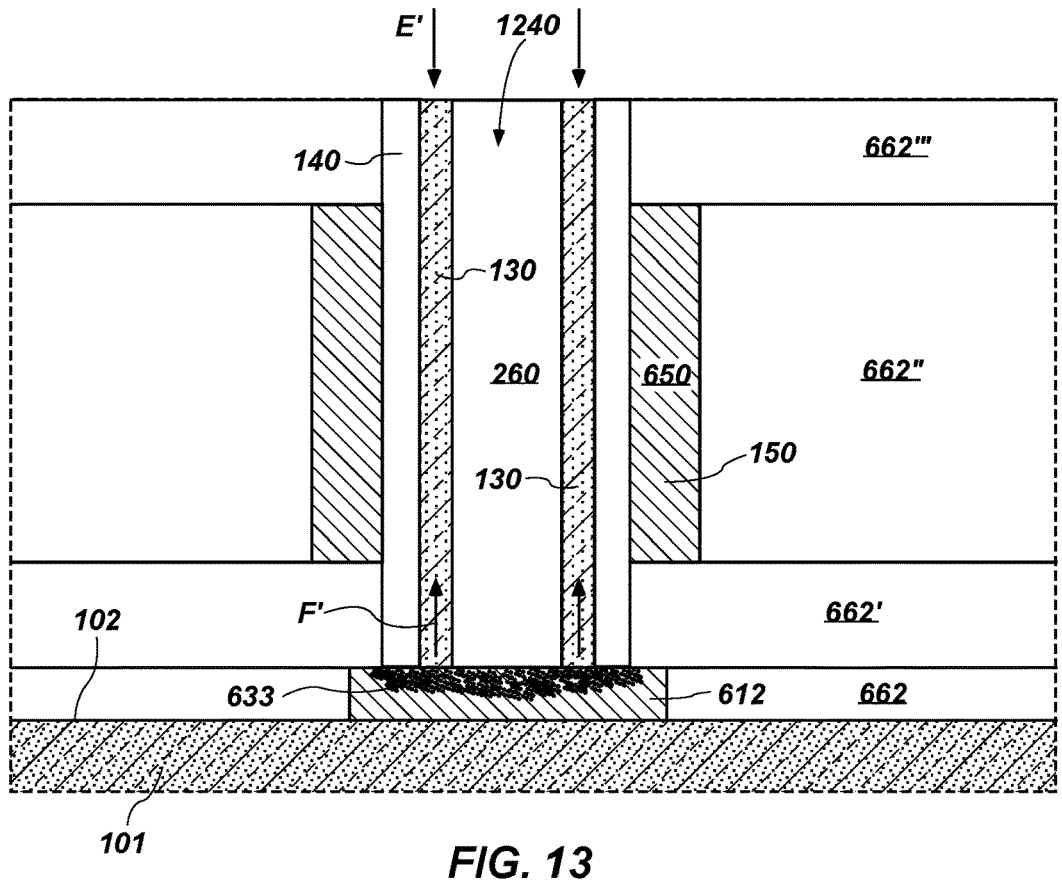
Figure 14:
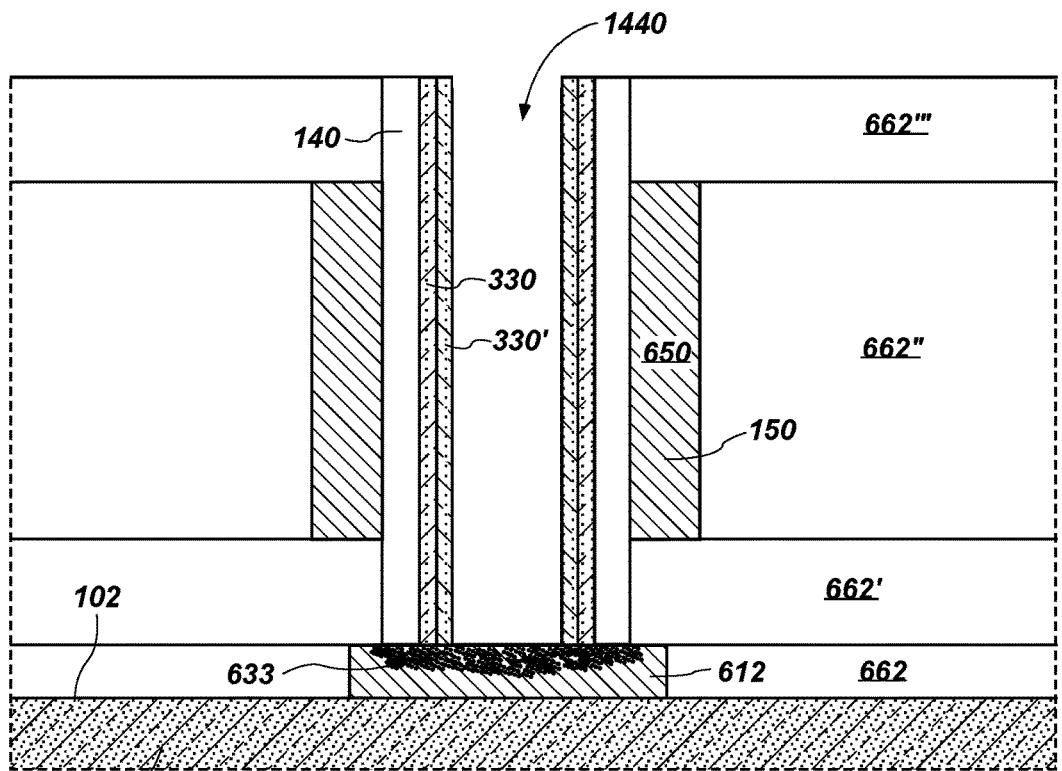
FIGS. 14 through 17 are cross-sectional, elevational, schematic illustrations during various stages of processing to fabricate the string driver of FIG. 3, wherein the stages of FIGS. 14 through 17 follow those of FIGS. 6 through 9.

With reference to FIGS. 12 and 13, illustrated are various stages of a method of forming the string driver 200 of FIG. 2.

The stage of FIG. 12 may follow the stages illustrated in FIGS. 6 through 10. After forming the high band gap material 130 in the opening 940 (FIG. 10) another opening 1240 may be formed through the high band gap material 130 to expose a portion of the conductive material 612. The exposed portion of the conductive material 612 may be doped with the at least one dopant 633, in embodiments in which the string driver 200 (FIG. 2) has drain/source regions 222 and offset regions 224 that include the at least one dopant 633.

With reference to FIG. 13, the other opening 1240 may then be filled with the other dielectric material 260, discussed above with regard to FIG. 2. In embodiments in which the string driver 200 (FIG. 2) includes the at least one dopant 633, an additional amount of the at least one dopant 633 may be implanted into the upper surface of the high band gap material 130, as indicated by arrows E', to form the doped high band gap material 132 of the upper portion of the drain/source regions 222 of FIG. 2. A thermal treatment may cause the at least one dopant 633 to diffuse into a lower portion of the high band gap material 130, as indicated by arrows F', to form the doped high band gap material 132 of the lower portion of the drain/source regions 222 of FIG. 2. The thermal treatment (arrows F') may precede, be concurrent to, or follow the additional implantation (arrows E'). Filling the other opening 1240 with the other dielectric material 260 may precede or follow both or either of the additional implantation (arrows E') and the thermal treatment (arrows F'). Otherwise, in embodiments in which the string driver does not include the at least one dopant 633, no additional doping (arrows E') or thermal treatment may be performed. Accordingly, the amount of the additional amount of the at least one dopant 633 represented by arrows E' may be zero (for forming the drain/source regions 222 (FIG. 2) without the at least one dopant 633) or may be greater than zero (for forming the drain/source regions 222 (FIG. 2) with the at least one dopant 633). The upper portion of the electrodes 112 (FIG. 2) may then be formed over the dielectric material 140, the high band gap material 130, and the other dielectric material 260 to form the string driver 200 of FIG. 2.

Alternatively, in some embodiments, the stage illustrated in FIG. 12 may follow that of FIG. 9, wherein the high band gap material 130 may be formed by depositing the high band gap material 130 along the interior sidewalls of the dielectric material 140, leaving a central portion of the opening 940 of FIG. 9 open to form the other opening 1240. The other opening 1240 may then be filled with the other dielectric material 260 in the stage of FIG. 13.

With reference to FIGS. 14 through 17, illustrated are various stages in a method of forming the string driver 300 of FIG. 3. The stage of FIG. 14 may be preceded by the stages of FIGS. 6 through 9. After forming the opening 940 of FIG. 9, the high band gap material 330 of the outer sub-region may be formed (e.g., conformally deposited) on the dielectric material 140, and the other high band gap material 330' of the inner sub-region may be formed (e.g., conformally deposited) on the material 330 of the outer sub-region. A central portion may remain open, forming another opening 1440.

Figure 15:
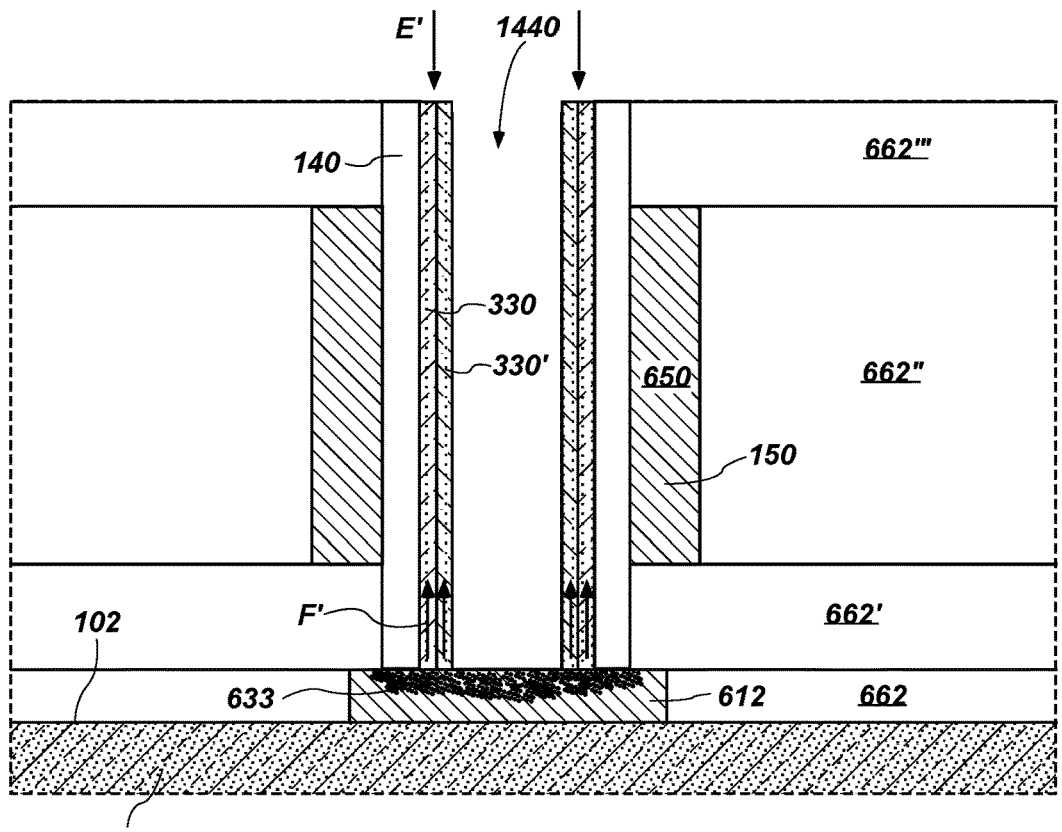

With reference to FIG. 15, in embodiments in which the string driver 300 (FIG. 3) includes the at least one dopant 633, an additional amount of the at least one dopant 633 may be implanted into an upper portion of both of the high band gap materials 330, 330', as indicated by arrows E', to form the doped high band gap material 332, 332' of the upper portion of the drain/source regions 322 of FIG. 3. Before, simultaneous with, or after the implantation (arrows E'), a thermal treatment may cause the at least one dopant 633 to diffuse from the conductive material 612 into a lower portion of the high band gap materials 330, 330', as indicated by arrows F', to form the doped high band gap material 332, 332' of the lower portion of the drain/source regions 322 of FIG. 3. Otherwise, in embodiments in which the string driver 300 (FIG. 3) does not include the at least one dopant 633, no additional doping (arrows E') or thermal treatment may be performed. Accordingly, the amount of the additional amount of the at least one dopant 633 represented by arrows E' may be zero (for forming the drain/source regions 322 (FIG. 3) without the at least one dopant 633) or may be greater than zero (for forming the drain/source regions 322 (FIG. 3) with the at least one dopant 633).

Figure 16:
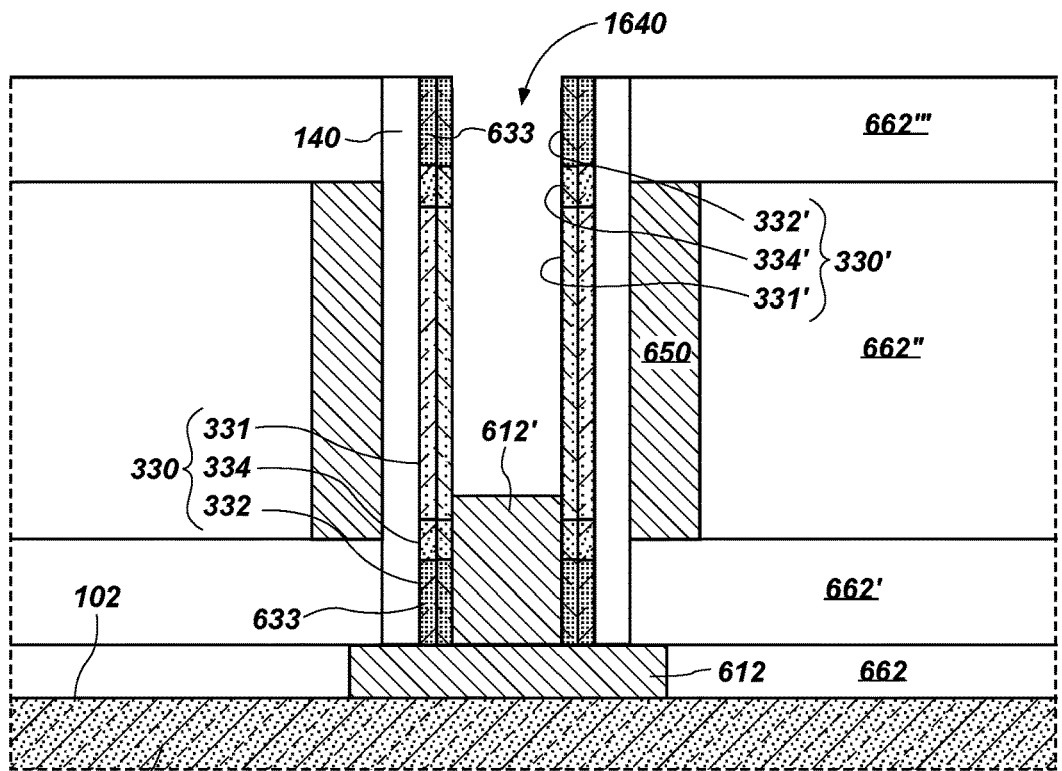

With reference to FIG. 16, an additional amount of conductive material 612' (e.g., the conductive material 612) may be formed (e.g., deposited) in the other opening 1440 (FIG. 15), to form a partially filled opening 1640. The conductive material 612' may be the same as, or different than, the conductive material 612 of the remainder of the lower portion of the source/drain electrodes 312 (FIG. 3).

Figure 17:
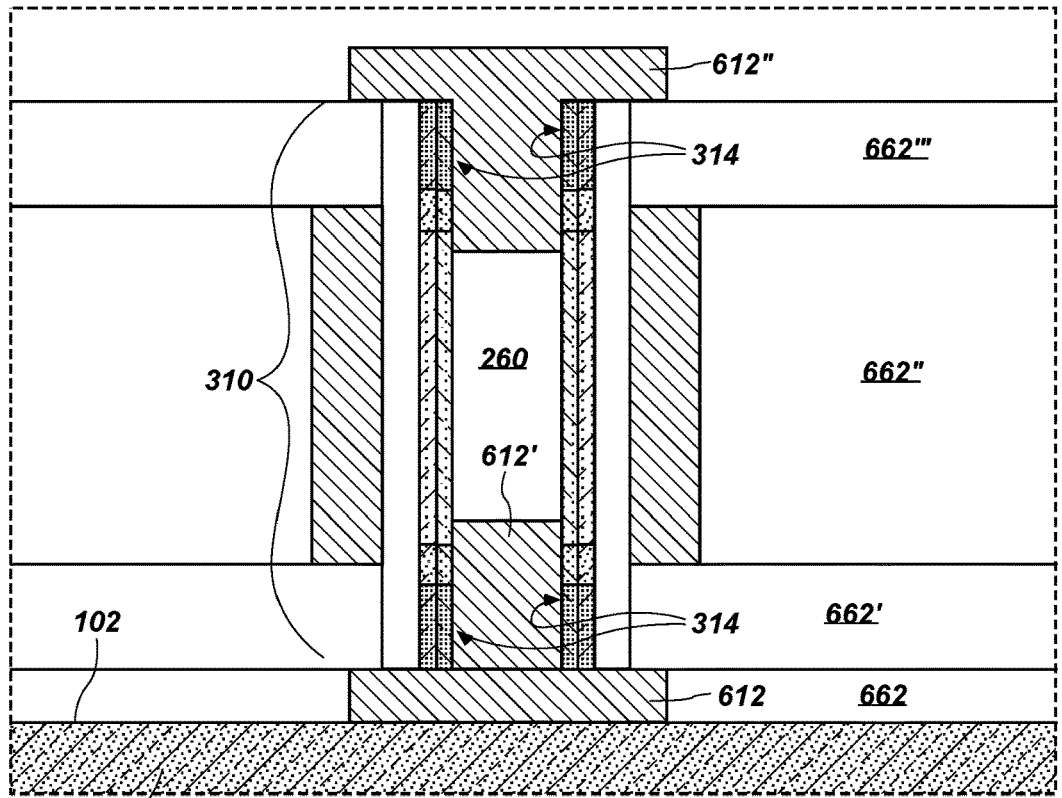

With reference to FIG. 17, the other dielectric material 260 may be formed (e.g., deposited) over the additional amount of the conductive material 612', and another amount of the conductive material 612" formed (e.g., deposited) over the other dielectric material 260 to form the upper portion of the sidewall contact extension portions 314 of the upper portion of the source/drain electrodes 312 (FIG. 3). The other amount of the conductive material 612" may be same as or different than the conductive material 612 and the additional amount of the conductive material 612'.

In forming the other dielectric material 260 within the partially filled opening 1640, the other dielectric material 260 may be formed to not fill the opening 1640. Alternatively, the other dielectric material 260 may be formed to fill the opening 1640 and then a portion removed (e.g., etched) to recess an upper surface of the dielectric material 260 relative to an upper surface of the fourth portion of the dielectric material 662'''.

The other amount of the conductive material 612" may be formed to fill the remainder of the opening 1640 and to extend above the upper surface of the fourth portion of the dielectric material 662''' and then patterned (e.g., etched) to form the upper portion of the source/drain electrodes 312 (FIG. 3), with the sidewall contact extension portion 314 extending into the pillar portion 310.

Figure 18:
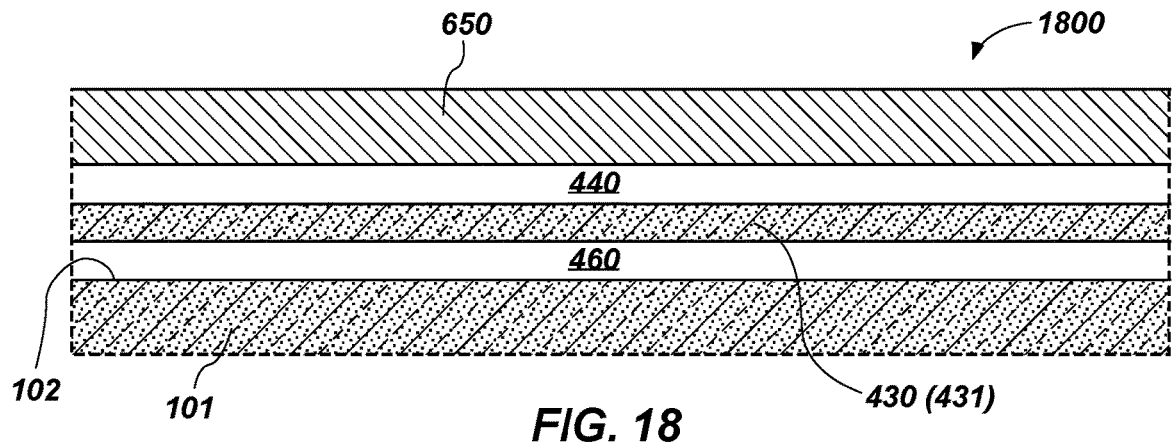
FIGS. 18 through 20 are cross-sectional, elevational, schematic illustrations during various stages of processing to fabricate the string driver of FIG. 4.
Figure 19:
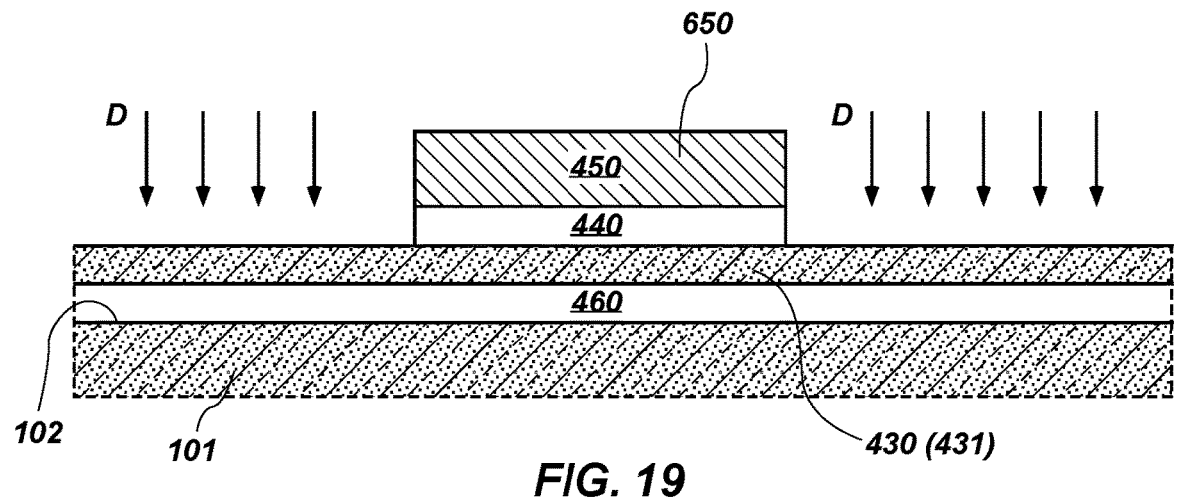
Figure 20:
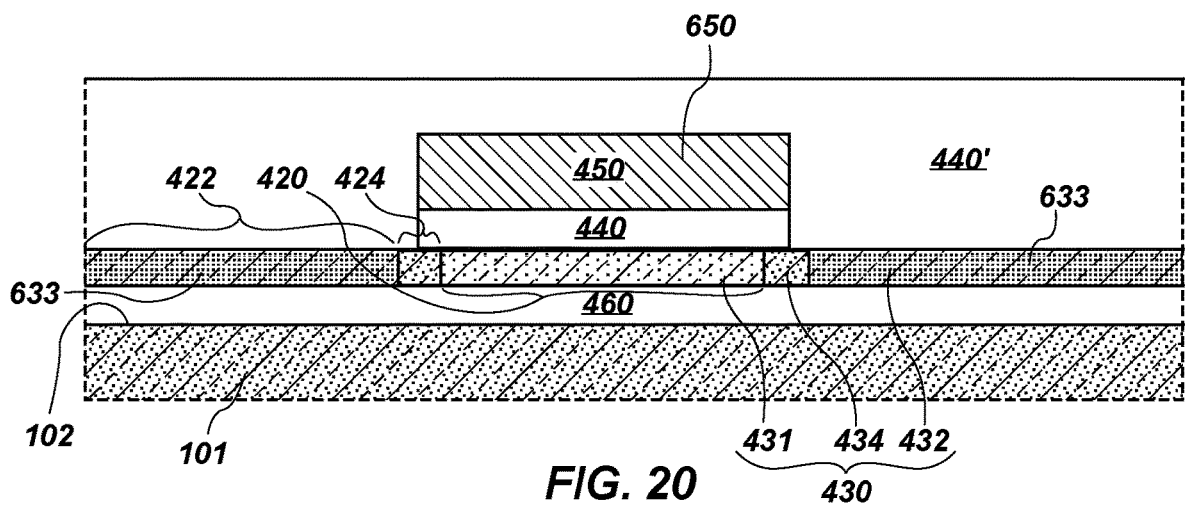

With reference to FIGS. 18 to 20, illustrated are various stages in a method of forming the string driver 400 of FIG. 4. A precursor structure 1800 may be formed by forming the other dielectric material 460 over the substrate 101 (e.g., on the primary surface 102 of the substrate 101), forming the high band gap material 430 (which, at this stage, may consist of the undoped high band gap material 431 (FIG. 4)) over the other dielectric material 460, forming the dielectric material 440 over the high band gap material 430, and forming the conductive material 650 over the dielectric material 440.

With reference to FIG. 19, the precursor structure 1800 may then be patterned (e.g., etched) to the high band gap material 430 to define the gate region 450 of the conductive material 650 and a region of the dielectric material 440 spacing the conductive material 650 from the high band gap material 430.

In embodiments in which the string driver 400 (FIG. 4) includes the at least one dopant 633, implantation may be performed (FIG. 19) to implant the at least one dopant 633 (FIG. 20) into the exposed portions of the high band gap material 430, as indicated by arrows D, to form the drain/source regions 422 of the doped high band gap material 432 offset, by the offset regions 424 of less-doped high band gap material 434, from the channel region 420 of the undoped high band gap material 431. Otherwise, in embodiments in which the string driver 400 (FIG. 4) does not include the at least one dopant 633, no implantation (arrows D) may be performed. Accordingly, the amount of the at least one dopant 633 represented by arrows D may be zero (for forming the drain/source regions 422 (FIG. 4) without the at least one dopant 633) or may be greater than zero (for forming the drain/source regions 422 (FIG. 4) with the at least one dopant 633). Another amount of the dielectric material 440' may then be formed about the gate region 450.

With reference to FIGS. 21 to 24, illustrated are various stages in a method of forming the string driver 500 of FIG. 5. As with the method of FIGS. 18 to 20, the other dielectric material 460 is formed over the substrate 101, and the high band gap material 430 is formed over the other dielectric material 460. The low band gap material 530 is also formed over the dielectric material 460. At this stage, the high band gap material 430 may be the undoped high band gap material 431, and the low band gap material 530 may also be undoped.

The low band gap material 530 may be formed, patterned (e.g., etched) and then the high band gap material 430 formed around the low band gap material 530 and planarized to form a precursor structure 2100 with the low band gap material 530 inlaid in the high band gap material 430. Alternatively, the high band gap material 430 may be formed over the other dielectric material 460 in the same manner as FIG. 18, then patterned to form an opening that is then filled with the low band gap material 530 and planarized to form the precursor structure 2100 with the low band gap material 530 inlaid in the high band gap material 430.

Figure 21:
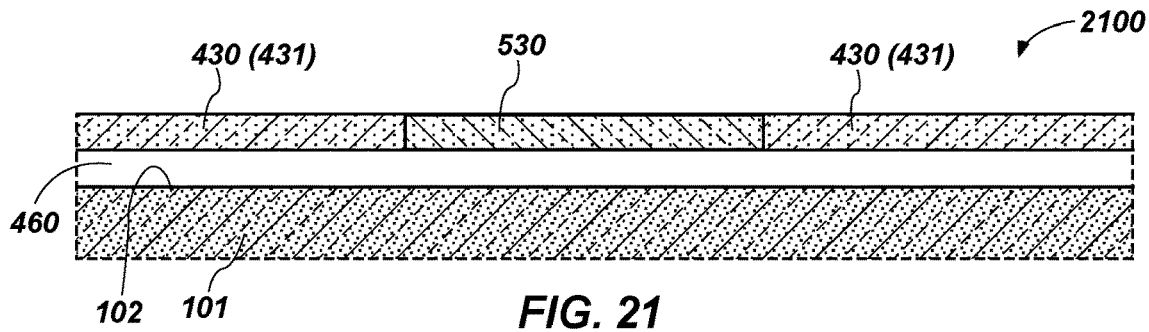
FIGS. 21 through 24 are cross-sectional, elevational, schematic illustrations during various stages of processing to fabricate the string driver of FIG. 5.
Figure 22:
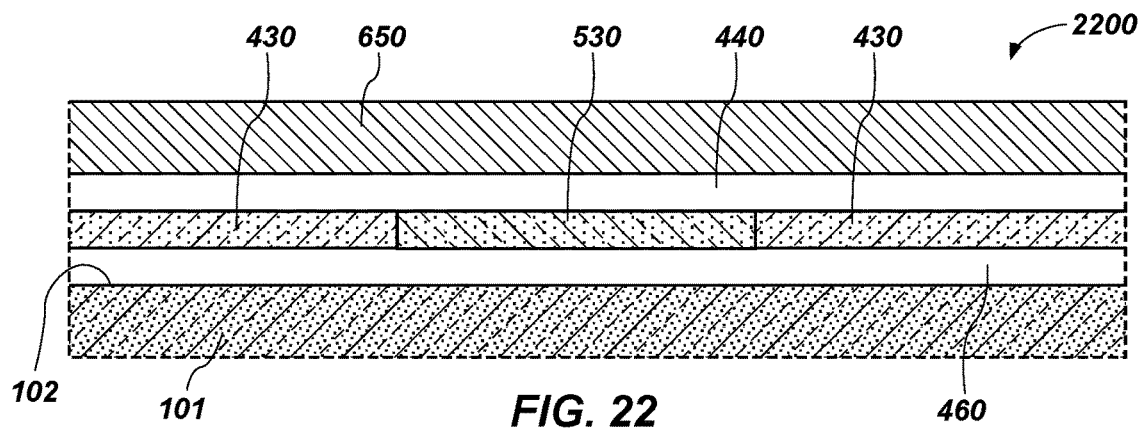
Figure 23:
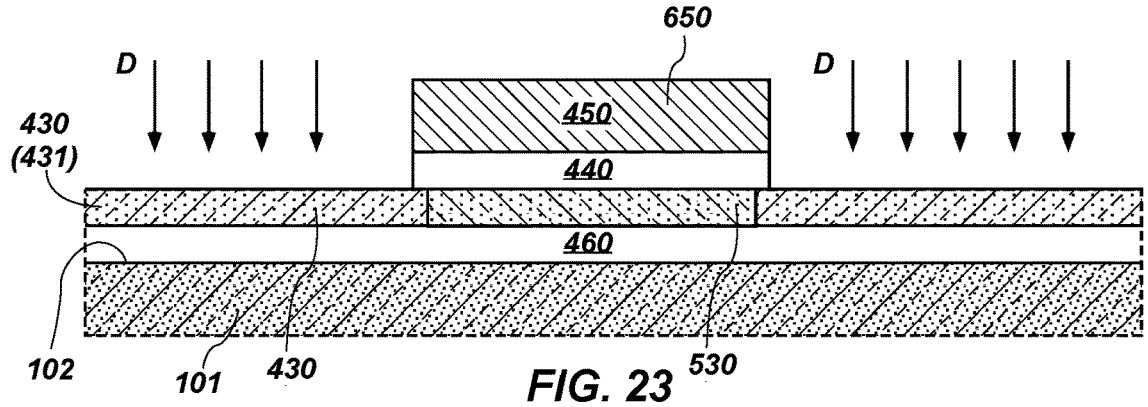
Figure 24:
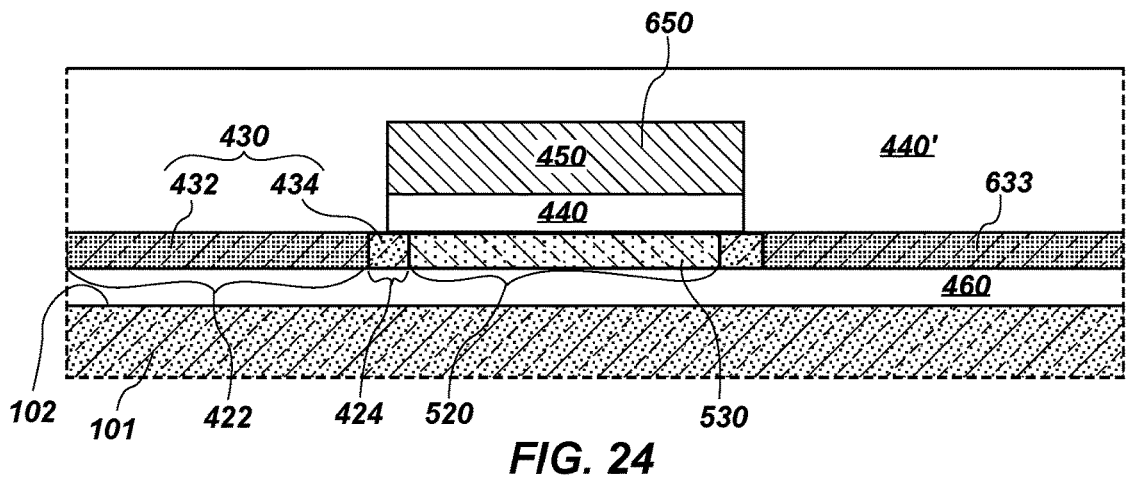

The dielectric material 440 and then the conductive material 650 may be formed, consecutively, over the precursor structure 2100 of FIG. 21 to form a precursor structure 2200 of FIG. 22. The precursor structure 2200 may then be patterned (e.g., etched) to expose portions of the high band gap material 430 where the drain/source regions 422 (FIG. 5) are to be formed. In embodiments in which the string driver 500 (FIG. 5) includes the at least one dopant 633, the at least one dopant 633 (FIG. 24) may then be implanted into the high band gap material 430, as indicated by arrows D of FIG. 23. During the implantation, the low band gap material 530 may not be exposed; rather, it may remain covered by the remaining portion of the dielectric material 440 and the gate region 450 of the conductive material 650. The implantation (arrows D) forms the drain/source regions 422 of the doped high band gap material 432 offset from the channel region 520 of the low band gap material 530 (undoped) by the offset regions 424 of the less-doped high band gap material 434. Otherwise, in embodiments in which the string driver 500 (FIG. 5) does not include the at least one dopant 633, no implantation (arrows D) may be performed. Accordingly, the amount of the at least one dopant 633 represented by arrows D may be zero (for forming the drain/source regions 422 (FIG. 5) without the at least one dopant 633) or may be greater than zero (for forming the drain/source regions 422 (FIG. 5) with the at least one dopant 633). The other amount of the dielectric material 440' may then be formed about the gate region 450.

In forming the high band gap material 430 (FIGS. 18 and 21), a low-temperature (e.g., less than about 400° C.) deposition process may be used. Such deposition process may include one or more of atomic layer deposition (ALD), and chemical vapor deposition (CVD), for example and without limitation. Therefore, the high band gap material 430 may be formed without thermally degrading previously formed materials and structures.

Accordingly, disclosed is a method of forming a string driver. The method comprises forming a high band gap material. A dielectric material is formed adjacent the high band gap material. A region of a conductive material is formed adjacent the dielectric material. The region of the conductive material is spaced from the high band gap material by at least the dielectric material.

Figure 25:
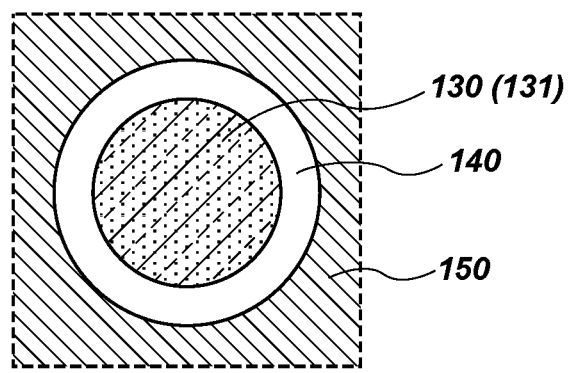
FIG. 25 is a cross-sectional, top plan, schematic illustration of the string driver of FIG. 1, taken along section line A-A.

With reference to FIG. 25, illustrated is a top plan, cross-sectional, schematic illustration of the string driver 100 of FIG. 1, taken along section line A-A. The pillar portion 110 (FIG. 1) may define a round (e.g., circular) horizontal cross-sectional area. The gate region 150 may also define a round horizontal cross-sectional area, with a peripheral edge evenly distributed about the center of the pillar portion 110 (FIG. 1). However, as illustrated in FIG. 25, the horizontal cross-sectional shape of the gate region 150 may have an alternative shape (e.g., non-curved, non-round, non-circular).

Figure 26:
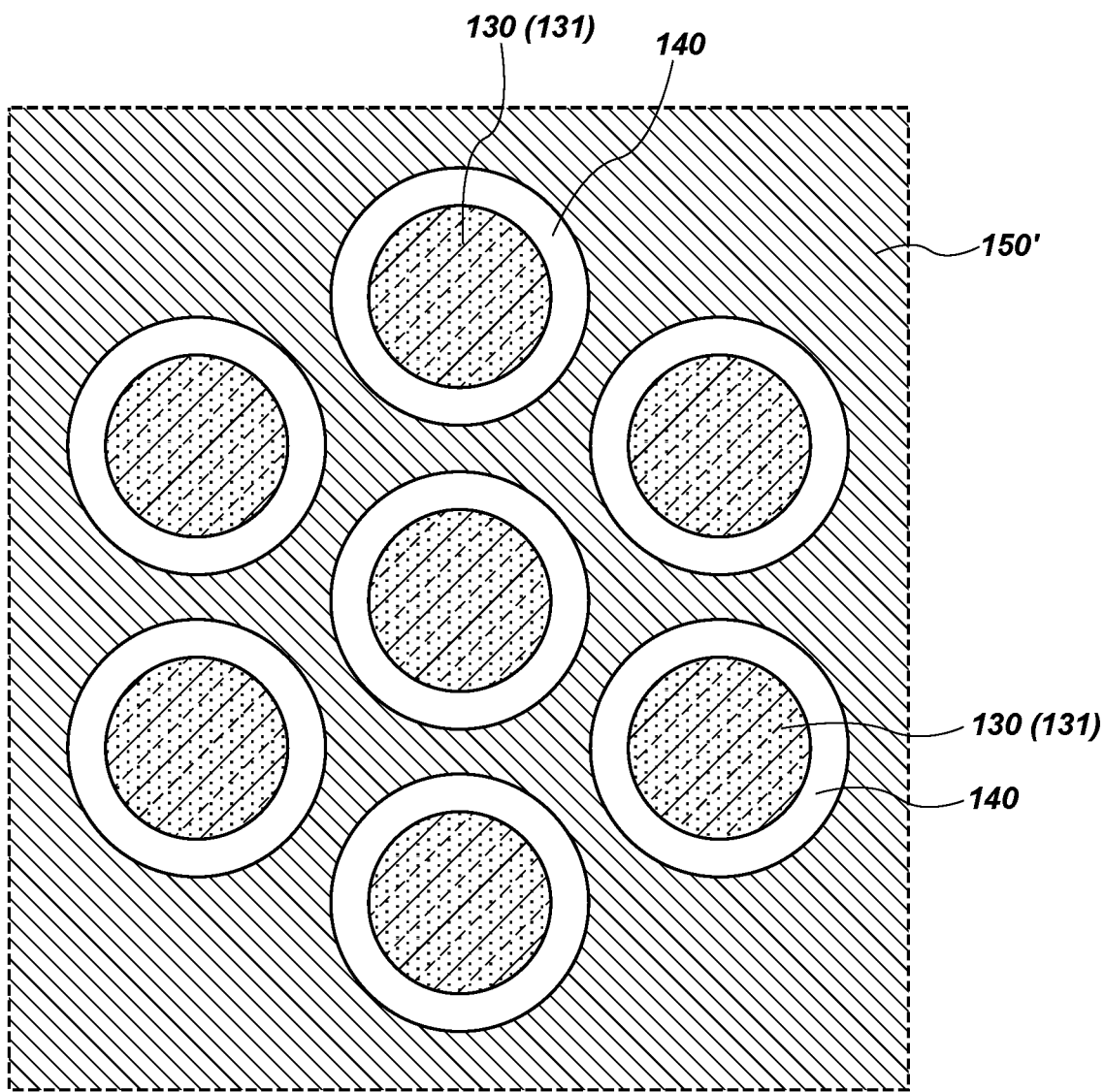
FIG. 26 is a cross-sectional, top plan, schematic illustration of a string driver according to an embodiment of the present disclosure, wherein the string driver includes a plurality of pillars of channel material, such as a plurality of the pillars of channel material of the string driver of FIG. 1.

For example, and without limitation, a gate region 150' may extend about more than one pillar portion 110 (FIG. 1) of the high band gap material 130, as illustrated in FIG. 26. Thus, more than one channel region 120 (FIG. 1) of the high band gap material 130 (and, therefore, more than one pair of the drain/source regions 122 (FIG. 1)) may be associated with one gate region 150' structure. The inclusion of a plurality of the pillar portions 110 (FIG. 1) of the high band gap material 130 may enhance the current drive of the string driver during operation.

Figure 27:
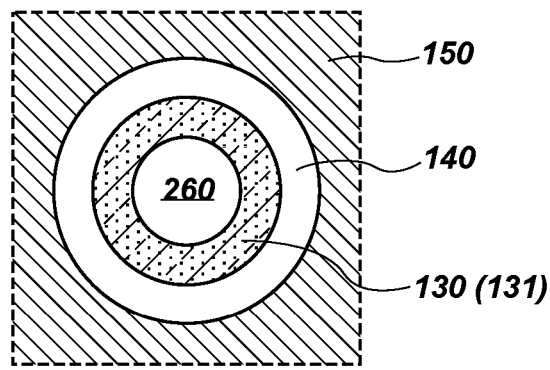
FIG. 27 is a cross-sectional, top plan, schematic illustration of the string driver of FIG. 2, taken along section line B-B.
Figure 28:
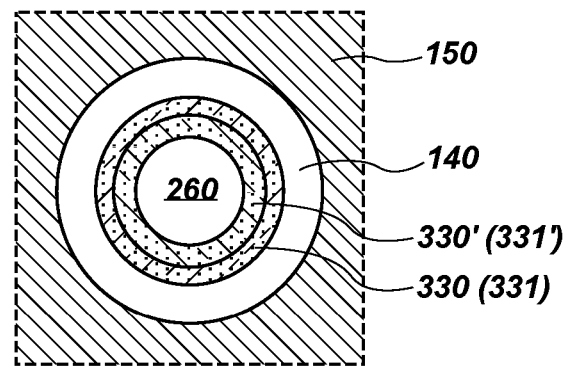
FIG. 28 is a cross-sectional, top plan, schematic illustration of the string driver of FIG. 3, taken along section line C-C.

FIGS. 27 and 28 are top plan, cross-sectional, schematic illustrations of the string driver 200 of FIG. 2, taken along section line B-B, and of the string driver 300 of FIG. 3, taken along section line C-C, respectively. Again, the gate region 150 of either structure 200, 300 may extend laterally beyond what is illustrated in FIG. 2 or 3.

Figure 29:
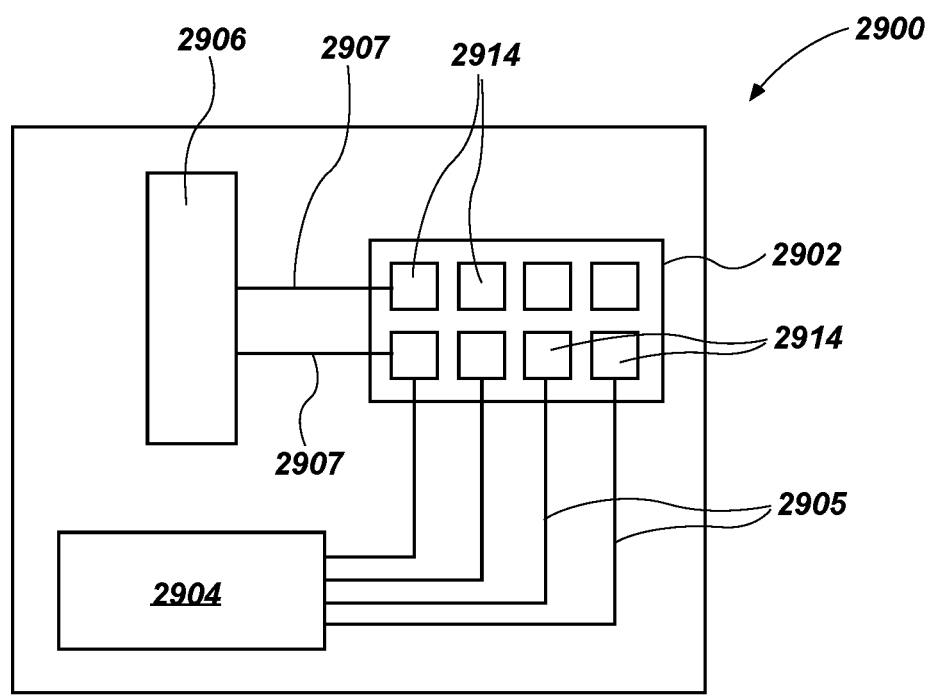
FIG. 29 is a simplified block diagram of a semiconductor device including an array of charge storage devices and a string driver according to an embodiment of the present disclosure.

With reference to FIG. 29, illustrated is a simplified block diagram of a semiconductor device 2900 implemented according to one or more embodiments described herein. The semiconductor device 2900 includes an array 2902 of a plurality of charge storage devices 2914 (e.g., non-volatile memory devices), which array 2902 may be, for example and without limitation, a two-dimensional array of non-volatile memory devices (e.g., 2D NAND) or a three-dimensional array of non-volatile memory devices (e.g., 3D NAND). The semiconductor device 2900 further includes a control logic component 2904 in operable communication with at least some of the charge storage devices 2914 via data lines 2905. A string driver 2906 is in operable communication with at least some of the charge storage devices 2914 of the array 2902 via access lines 2907 (e.g., wordlines). The string driver 2906 may include any of the string drivers 100, 200, 300, 400, and 500 (FIGS. 1 through 5, respectively), formed by any of the aforementioned, associated methods. The control logic component 2904 may be configured to operably interact with the array 2902 so as to read from or write to any or all charge storage devices 2914, while the string driver 2906 may be configured to operably interact with the array 2902 by driving current to the access lines 2907 during the reading from or writing to of the charge storage devices 2914.

Accordingly, disclosed is a device comprising an array of charge storage devices. The device also comprises access lines in operable communication with the array of charge storage devices. A string driver is in operable communication with at least one access line of the access lines. The string driver comprises a drain region and a source region comprising a high band gap material. The string driver also comprises at least one channel region comprising the high band gap material or a low band gap material. The at least one channel region extends between the drain region and the source region.

Figure 30:
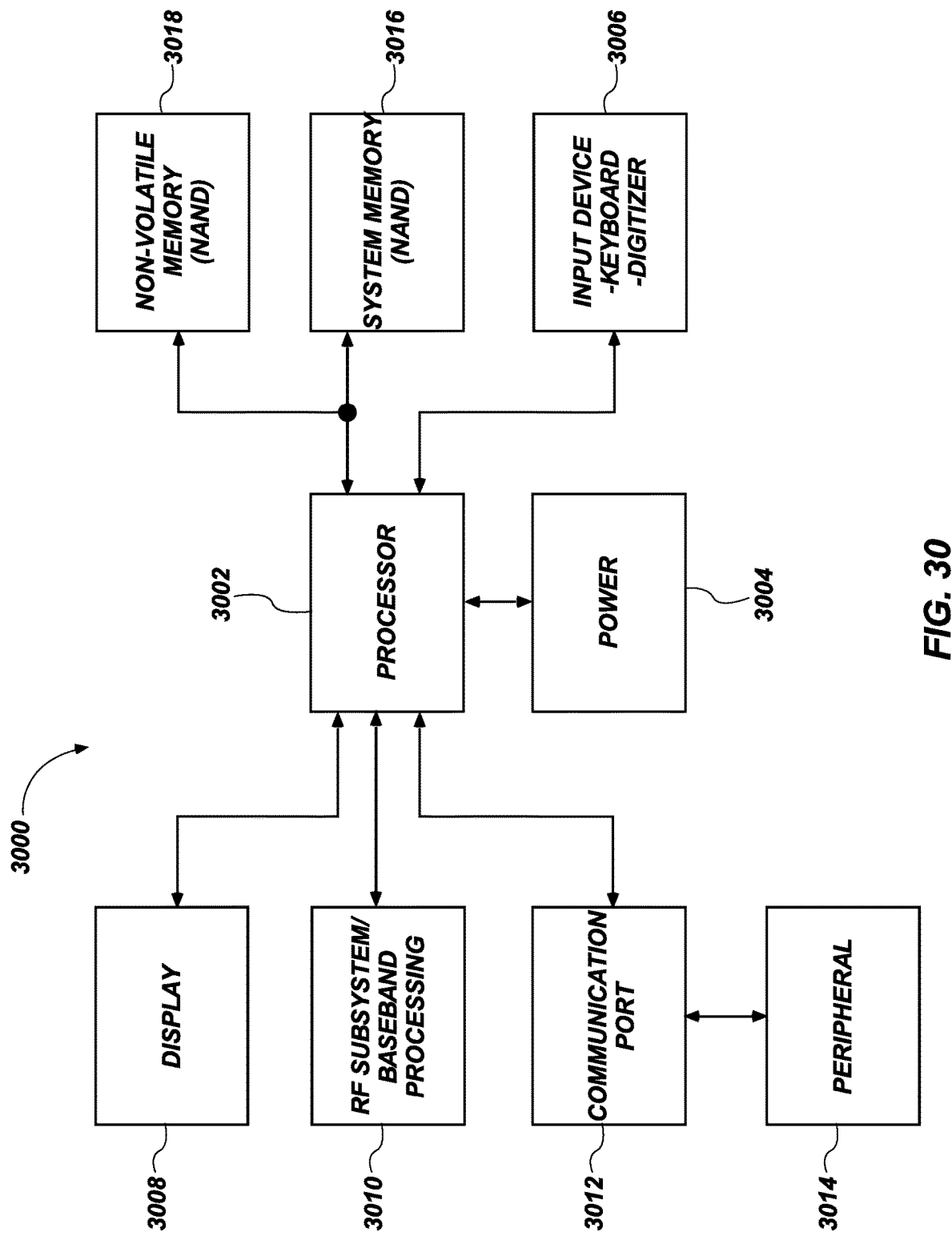
FIG. 30 is a simplified block diagram of a system implemented according to one or more embodiments of the present disclosure.

With reference to FIG. 30, depicted is a non-volatile memory system (e.g., a processor-based system) 3000. The system 3000 may include various electronic devices manufactured in accordance with embodiments of the present disclosure. The system 3000 may be any of a variety of types such as a computer, pager, cellular phone, personal organizer, control circuit, or other electronic device. The system 3000 may include one or more processors 3002, such as a microprocessor, to control the processing of system functions and requests in the system 3000. The processor 3002 and other subcomponents of the system 3000 may include charge storage device arrays in operable communication with string drivers manufactured in accordance with embodiments of the present disclosure.

The system 3000 may include a power supply 3004 in operable communication with the processor 3002. For example, if the system 3000 is a portable system, the power supply 3004 may include one or more of a fuel cell, a power scavenging device, permanent batteries, replaceable batteries, and rechargeable batteries. The power supply 3004 may also include an AC adapter; therefore, the system 3000 may be plugged into a wall outlet, for example. The power supply 3004 may also include a DC adapter such that the system 3000 may be plugged into a vehicle cigarette lighter or a vehicle power port, for example.

Various other devices may be coupled to the processor 3002 depending on the functions that the system 3000 performs. For example, a user interface 3006 may be coupled to the processor 3002. The user interface 3006 may include input devices such as buttons, switches, a keyboard, a light pen, a mouse, a digitizer and stylus, a touch screen, a voice recognition system, a microphone, or a combination thereof. A display 3008 may also be coupled to the processor 3002. The display 3008 may include an LCD display, an SED display, a CRT display, a DLP display, a plasma display, an OLED display, an LED display, a three-dimensional projection, an audio display, or a combination thereof. Furthermore, an RF sub-system/baseband processor 3010 may also be coupled to the processor 3002. The RF sub-system/baseband processor 3010 may include an antenna that is coupled to an RF receiver and to an RF transmitter (not shown). A communication port 3012, or more than one communication port 3012, may also be coupled to the processor 3002. The communication port 3012 may be adapted to be coupled to one or more peripheral devices 3014, such as a modem, a printer, a computer, a scanner, or a camera, or to a network, such as a local area network, remote area network, intranet, or the Internet, for example.

The processor 3002 may control the system 3000 by implementing software programs stored in the memory. The software programs may include an operating system, database software, drafting software, word processing software, media editing software, or media playing software, for example. The memory is operably coupled to the processor 3002 to store and facilitate execution of various programs. For example, the processor 3002 may be coupled to system memory 3016, which may include an array of charge storage devices (e.g., 2D NAND or 3D NAND) in operable communication with a string driver including, e.g., any of the string drivers 100, 200, 300, 400, and 500 of FIGS. 1 to 5, respectively. Alternatively, or additionally, the system memory 3016 may include dynamic random access memory (DRAM), static random access memory (SRAM), magnetic random access memory (MRAM), racetrack memory, and other known memory types. The system memory 3016 may include volatile memory, non-volatile memory, or a combination thereof. The system memory 3016 is typically large so that it may store dynamically loaded applications and data.

The processor 3002 may also be coupled to non-volatile memory 3018, which is not to suggest that system memory 3016 is necessarily volatile. The non-volatile memory 3018 may include one or more of read-only memory (ROM) such as an EPROM, resistive read-only memory (RROM), and flash memory (e.g., 2D NAND or 3D NAND) in operable communication with a string driver (e.g., having any of the string drivers 100, 200, 300, 400, 500 of FIGS. 1 to 5, respectively) and to be used in conjunction with the system memory 3016. The size of the non-volatile memory 3018 is typically selected to be just large enough to store any necessary operating system, application programs, and fixed data. Additionally, the non-volatile memory 3018 may include a high capacity memory such as disk drive memory, such as a hybrid-drive including resistive memory or other types of non-volatile solid-state memory, for example.

Accordingly, disclosed is a system comprising an array of non-volatile memory devices. At least one string driver is in operable communication with the array. The string driver comprises a high band gap material. At least one peripheral device is in operable communication with the array of non-volatile memory devices. The at least one peripheral device comprises circuitry in operable communication with the at least one string driver.

While the disclosed device structures and methods are susceptible to various modifications and alternative forms in implementation thereof, specific embodiments have been shown by way of example in the drawings and have been described in detail herein. However, it should be understood that the present invention is not intended to be limited to the particular forms disclosed. Rather, the present invention encompasses all modifications, combinations, equivalents, variations, and alternatives falling within the scope of the present disclosure as defined by the following appended claims and their legal equivalents.

What is claimed is:

1. A device comprising a string driver, the string driver comprising:
   at least one pillar extending vertically between a pair of electrodes, the at least one pillar comprising:
      a channel region between a drain region and a source region; and
      a dielectric material in a central portion of the at least one pillar, the channel region laterally surrounding the dielectric material,
      wherein at least one of the channel region, the drain region, and the source region comprises a high band gap material; and
   only one gate region laterally surrounding the channel region of a pillar of the at least one pillar, the gate region comprising an electrically conductive material and spaced from the high band gap material,
   wherein each electrode, of the pair of electrodes, comprises a vertically extending portion surrounding by a portion of the high band gap material.

2. The device of claim 1, wherein the high band gap material is selected from the group consisting of zinc oxide, indium gallium zinc oxide, indium zinc oxide, silicon carbide, tin oxide, and gallium arsenide.

3. The device of claim 2, wherein the high band gap material comprises amorphous indium gallium zinc oxide.

4. The device of claim 1, wherein the channel region comprises the high band gap material.

5. The device of claim 4, further comprising another dielectric material spacing the high band gap material of the channel region from the gate region.

6. The device of claim 1, wherein the drain region and the source region are each spaced from the channel region by an offset region of about 0 micrometers (about 0 μm).

7. The device of claim 1, wherein the channel region comprises the high band gap material and another high band gap material laterally surrounding the dielectric material.

8. The device of claim 1, wherein the at least one pillar comprises:
   a pillar comprising the channel region, the drain region, and the source region; and
   another pillar comprising another channel region, another drain region, and another source region, at least one of the other channel region, the other drain region, and the other source region comprising the high band gap material,
   the gate region laterally surrounding the channel region and the other channel region.

9. The device of claim 1, wherein:
   the channel region comprises the high band gap material;
   the channel region further comprises another high band gap material laterally between the high band gap material and the gate region; and
   the gate region laterally surrounds both the high band gap material and the other high band gap material.

10. The device of claim 1, wherein the vertically extending portion of each electrode, of the pair of electrodes, extends vertically past an end of the gate region.

11. The device of claim 1, wherein the drain region and the source region are each spaced from the channel region by an offset region of less than 0.2 micrometers (less than 0.2μm) but greater than 0.1 micrometers (greater than 0.1μm).

12. A device, comprising:
an array of charge storage devices;
access lines in operable communication with the array of charge storage devices; and
a string driver in operable communication with at least one access line of the access lines, the string driver comprising:
at least one pillar extending vertically between a pair of electrodes, the at least one pillar comprising:
a channel region between a drain region and a source region; and
a dielectric material in a central portion of the at least one pillar, the channel region laterally surrounding the dielectric material,
wherein at least one of the channel region, the drain region, and the source region comprises a high band gap material; and
only one gate region laterally surrounding the channel region of a pillar of the at least one pillar, the gate region comprising an electrically conductive material and spaced from the high band gap material,
wherein each electrode, of the pair of electrodes, comprises a vertically extending portion surrounded by a portion of the high band gap material.

13. The device of claim 12, wherein the array of charge storage devices is a three-dimensional NAND array comprising a plurality of stacked tiers of the charge storage devices.

14. The device of claim 12, wherein the string driver comprises a plurality of the pillars of the at least one pillar, the one gate region laterally surrounding the channel regions of the pillars of the plurality.

15. The device of claim 12, wherein:
the source region comprises the high band gap material doped with at least one dopant; and
the drain region comprises the high band gap material doped with the at least one dopant,
the at least one dopant selected from the group consisting of aluminum (Al) and silicon (Si).

16. A system, comprising:
an array of non-volatile memory devices;
at least one string driver in operable communication with the array, a string driver, of the at least one string driver, comprising:
at least one pillar extending vertically between a pair of electrodes, the at least one pillar comprising:
a channel region between a drain region and a source region; and
a dielectric material in a central portion of the at least one pillar, the channel region laterally surrounding the dielectric material,
wherein at least one of the channel region, the drain region, and the source region comprises a high band gap material; and
only one gate region laterally surrounding the channel region of a pillar of the at least one pillar, the gate region comprising an electrically conductive material and spaced from the high band gap material,
wherein each electrode, of the pair of electrodes, comprises a vertically extending portion surrounded by a portion of the high band gap material; and
at least one peripheral device in operable communication with the array of non-volatile memory devices, the at least one peripheral device comprising circuitry in operable communication with the at least one string driver.

17. A method of forming a string driver, the method comprising:
forming, on an electrode over a base material, a pillar comprising a dielectric material in a central portion of the pillar and comprising a high band gap material laterally surrounding the dielectric material;
forming another dielectric material adjacent the high band gap material; and
forming a region of an electrically conductive material adjacent the other dielectric material, the region of the electrically conductive material spaced from the high band gap material by at least the other dielectric material;
forming another electrode on the pillar,
wherein the pillar extends vertically between a pair of electrodes, the pair of electrodes comprising the electrode and the other electrode, the pillar comprising:
a channel region between a drain region and a source region; and
the dielectric material in the central portion of the pillar, the channel region laterally surrounding the dielectric material,
wherein at least one of the channel region, the drain region, and the source region of the string driver comprises the high band gap material,
wherein the string driver comprises only one gate region laterally surrounding the channel region of the pillar, the gate region comprising the electrically conductive material,
wherein the gate region is spaced from the high band gap material, and
wherein each electrode, of the pair of electrodes, comprises a vertically extending portion surrounded by a portion of the high band gap material.

18. The method of claim 17, wherein forming the pillar comprising the high band gap material comprises depositing the high band gap material at a temperature of less than 400° C.

19. The method of claim 17:
further comprising, before forming the pillar, forming an additional dielectric material over the base material; and
wherein forming the pillar comprises:
forming an opening through the additional dielectric material;
forming the other dielectric material in the opening;
forming the high band gap material on the other dielectric material; and
forming the dielectric material on the high band gap material.

20. The method of claim 17, further comprising doping portions of the high band gap material to form the drain region and the source region, the drain region comprising doped high band gap material, the source region comprising doped high band gap material, the drain region being spaced from the source region by an undoped portion of the high band gap material.

21. The method of claim 20:
further comprising, before forming the pillar:
forming another electrically conductive material supported by the base material, the electrode comprising the other electrically conductive material; and doping the other electrically conductive material with at least one dopant; and wherein forming the pillar comprises forming the high band gap material in physical contact with the other electrically conductive material doped with the at least one dopant; and wherein doping portions of the high band gap material comprises:
- exposing at least a lower portion of the high band gap material to heat to cause the at least one dopant to diffuse from the other electrically conductive material into the lower portion of the high band gap material; and
- implanting an additional amount of the at least one dopant into an upper portion of the high band gap material.

22. The method of claim 17, wherein:

forming the region of the electrically conductive material precedes forming the other dielectric material and precedes forming the high band gap material;

forming the other dielectric material comprises:
- forming an opening through the electrically conductive material; and
- forming the other dielectric material on the electrically conductive material exposed in the opening; and forming the pillar comprises forming the high band gap material on the other dielectric material.

23. The method of claim 22, further comprising forming another high band gap material along the high band gap material.

24. The method of claim 17, wherein:

forming the other dielectric material precedes forming the high band gap material, and forming the region of the electrically conductive material precedes forming the other dielectric material, the other dielectric material spacing the electrically conductive material from the high band gap material.

* * * * *

UNITED STATES PATENT AND TRADEMARK OFFICE
CERTIFICATE OF CORRECTION

PATENT NO. : 11,018,255 B2
APPLICATION NO. : 16/110217
DATED : May 25, 2021
INVENTOR(S) : Haitao Liu et al.

It is certified that error appears in the above-identified patent and that said Letters Patent is hereby corrected as shown below:

In the Claims
Claim 1, Column 18, Line 28, change "surrounding" to --surrounded--

Signed and Sealed this
Twentieth Day of July, 2021

Drew Hirshfeld
*Performing the Functions and Duties of the
Under Secretary of Commerce for Intellectual Property and
Director of the United States Patent and Trademark Office*